United States Patent
Kato et al.

(10) Patent No.: US 7,550,777 B2
(45) Date of Patent: Jun. 23, 2009

(54) LIGHT EMITTING DEVICE INCLUDING ADHESION LAYER

(75) Inventors: Hideaki Kato, Aichi-ken (JP); Mitsuhiro Inoue, Aichi-ken (JP); Hiroaki Hayashi, Aichi-ken (JP); Kazuyoshi Tahashi, Aichi-ken (JP)

(73) Assignees: Toyoda Gosei, Co., Ltd., Nishikasugai-gun, Aichi-ken (JP); Tsuchiya Co., Ltd., Nagoya-shi, Aichi-ken (JP)

( * ) Notice: Subject to any disclaimer, the term of this patent is extended or adjusted under 35 U.S.C. 154(b) by 882 days.

(21) Appl. No.: 10/753,870

(22) Filed: Jan. 9, 2004

(65) Prior Publication Data

US 2007/0194709 A1    Aug. 23, 2007

(30) Foreign Application Priority Data

| Jan. 10, 2003 | (JP) | ............................... 2003-004239 |
| Jan. 10, 2003 | (JP) | ............................... 2003-004240 |
| Jul. 16, 2003 | (JP) | ............................... 2003-197797 |
| Dec. 11, 2003 | (JP) | ............................... 2003-412959 |

(51) Int. Cl.
*H01L 23/34* (2006.01)
*H01J 1/62* (2006.01)

(52) U.S. Cl. .......................... 257/99; 257/712; 313/498

(58) Field of Classification Search ......... 313/484–487, 313/489, 498, 512, 467, 468, 499, 501–503; 257/678, 783, 796, 81, 99, 718, 719
See application file for complete search history.

(56) References Cited

U.S. PATENT DOCUMENTS

| 6,498,355 B1* | 12/2002 | Harrah et al. .................. 257/99 |
| 6,518,600 B1* | 2/2003 | Shaddock ..................... 257/98 |
| 2004/0027062 A1* | 2/2004 | Shiang et al. ............... 313/506 |
| 2004/0183172 A1* | 9/2004 | Saito et al. .................... 257/678 |
| 2006/0131601 A1* | 6/2006 | Ouderkirk et al. ............. 257/99 |
| 2006/0261364 A1* | 11/2006 | Suehiro et al. ............. 257/100 |
| 2007/0252161 A1* | 11/2007 | Meis et al. .................... 257/88 |

FOREIGN PATENT DOCUMENTS

| JP | 07-086640 | 3/1995 |
| JP | 2924961 | 5/1999 |
| JP | 2001-214093 | 8/2001 |
| JP | 2001-217466 | 8/2001 |
| JP | 3230518 | 9/2001 |
| JP | 3275308 | 2/2002 |
| JP | 3307316 | 5/2002 |
| JP | 2002-203989 | 7/2002 |
| JP | 2002-208733 | 7/2002 |
| JP | 3337000 | 8/2002 |

* cited by examiner

*Primary Examiner*—Peter Macchiarolo
(74) *Attorney, Agent, or Firm*—McGinn IP Law Group, PLLC

(57) ABSTRACT

A light emitting device has a light emitting element and an adhesion layer to bond the light emitting element to a mounting member. The adhesion layer is of inorganic material particles and a transparent inorganic binding layer to be formed between the neighboring inorganic material particles, and the inorganic material particles are substantially connected with each other in the adhesion layer. Another light emitting device has a light emitting element and a phosphor layer that radiates fluorescent light while being excited by light emitted from the light emitting element. The phosphor layer is of phosphor particles and transparent inorganic binding layer to be formed between the neighboring phosphor particles.

5 Claims, 23 Drawing Sheets

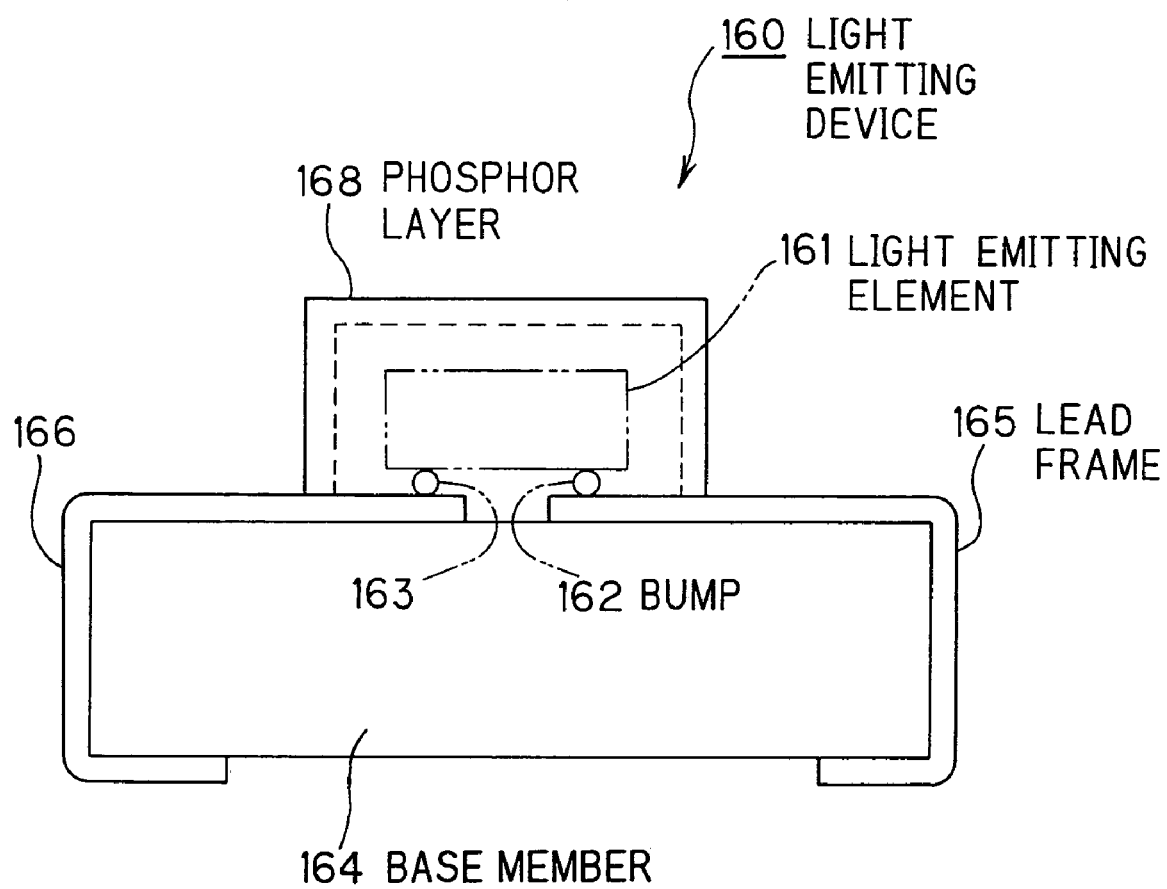

LIGHT EMITTING DEVICE INCLUDING ADHESION LAYER

The present application is based on Japanese patent application Nos. 2003-004239, 2003-412959, 2003-004240 and 2003-197797, the entire contents of which are incorporated herein by reference.

BACKGROUND OF THE INVENTION

1. Field of the Invention

This invention relates to a light emitting device and, particularly, to a light emitting device with an improved adhesion layer for bonding a light emitting element to its mounting member. Also, this invention relates to a light emitting device with an improved phosphor layer for wavelength-converting light emitted from a light emitting element.

2. Description of the Related Art

Conventionally, adhesive (adhesion layer) of resin is used for mounting a light emitting element on a lead frame as mounting member. In some cases, transparent resin such as epoxy resin is used as adhesive since a component of light emitted from the light emitting element is discharged toward the lead frame and it is necessary to reflect that light component on the lead frame.

However, the adhesion layer composed of resin cannot sufficiently radiate heat generated from the light emitting element to the lead frame (i.e., it lacks in heat radiation property). Also, a light emitting device with adhesion layer of resin cannot be treated at high temperature in solder reflow oven (i.e., it lacks in heat resistance property).

Japanese patent application laid-open No. 07-086640 (paragraphs 16 and 21) discloses to use low melting point glass as adhesive (adhesion layer). Also, it discloses that an insulative filler with good thermal conductivity is blended into the adhesive to enhance its heat radiation property to radiate heat generated from light emitting element.

The other related art is disclosed in Japanese patent application laid-open No. 2001-214093.

The adhesion layer disclosed above is expected to have good heat resistance and heat radiation properties as compared to an adhesion layer only composed of resin. However, as the output of light emitting element increases rapidly, higher heat resistance and heat radiation properties are required to the adhesion layer.

On the other hand, a light emitting device is suggested that light emitted from a light emitting element is wavelength-converted by phosphor material to obtain a desired emission color.

Japanese patent application laid-open No. 2001-217466 discloses a light emitting device that its light emitting element is covered with sealing resin material (phosphor layer) with phosphor particles dispersed therein. However, since resin included in the phosphor layer has moisture-absorption characteristics, the phosphor is likely to degrade due to absorbed moisture. So, Japanese patent application laid-open No. 2001-217466 (paragraph 15 etc.) suggests to use an inorganic material instead of resin while dispersing phosphors therein. This can prevent the degradation of phosphor due to moisture.

The other related arts are disclosed in Japanese patent application laid-open Nos. 2001-214093, 2002-208733, 2002-203989 and 2002-134790, and Japanese patent Nos. 3307316, 3337000, 3230158 and 2924961.

However, the phosphor layer of conventional light emitting device has problems below.

When an inorganic material such as glass is used as the matrix of phosphor layer, it is very difficult to homogeneously disperse phosphor particles in the matrix since the fluidity of inorganic material is low even in softened state. Even if a low melting point glass is used as the inorganic material, the fluidity in softened state is still low. Therefore, the amount of phosphor particles to be blended into glass must be limited. Because of this, the phosphor layer needs to be thickened to secure the amount of phosphor particles required to obtain sufficient fluorescent light. In this case, there occurs a difference in an amount of received light per unit volume from the light emitting element between the lower layer (light emitting element side) and upper layer (light emission surface side) of phosphor layer. As a result, lights to be radiated from the upper layer and lower layer differ in wavelength spectrum distribution and unevenness in emission color may occur depending on observation direction.

SUMMARY OF THE INVENTION

It is an object of the invention to provide a light emitting device that has an adhesion layer with enhanced heat resistance and heat radiation properties.

It is another object of the invention to provide a light emitting device that can prevent the degradation of phosphor and the occurrence of unevenness in emission color.

(1) According to the first aspect of the invention, a light emitting device comprises:
   a light emitting element; and
   an adhesion layer to bond the light emitting element to a mounting member;
   wherein the adhesion layer is composed of inorganic material particles and a transparent inorganic binding layer to be formed between the neighboring inorganic material particles, and the inorganic material particles are substantially connected with each other in the adhesion layer.

(2) According to the second aspect of the invention, an adhesion layer for bonding a light emitting element to a member comprises:
   diamond particles; and
   transparent inorganic binding layer;
   wherein the diamond particles are substantially connected each other in the adhesion layer.

(3) According to the third aspect of the invention, a method of forming an adhesion layer for bonding a light emitting element to a mounting member comprises the steps of:
   preparing adhesion layer precursor material by mixing inorganic-coating forming liquid and inorganic material particles; and
   thermally treating the adhesion layer precursor material while laying the adhesion layer precursor material between the light emitting element and the mounting member.

(4) According to the fourth aspect of the invention, a light emitting device comprises:
   a light emitting element; and
   an adhesion layer to bond the light emitting element to a mounting member;
   wherein the adhesion layer is formed by thermally creating adhesion layer precursor material that inorganic-coating forming liquid and diamond particles are mixed.

In the light emitting device thus composed, the ratio occupied by the inorganic material particles in the adhesion layer can be maximized. When the inorganic material particles are of material with high thermal conductivity such as diamond, the adhesion layer can have high thermal conductivity (heat radiation property).

The entire light emitting device can be composed of inorganic material. In such a case, it has a further enhanced heat resistance property and can be treated at high temperature in solder reflow oven.

(5) According to the fifth aspect of the invention, a method of making a light emitting device comprises the steps of:
- preparing precursor material by mixing inorganic-coating forming liquid and phosphor particles;
- molding a phosphor frame that opens in the optical axis of light emitting element using the precursor material; and
- fixing the light emitting element in the phosphor frame.

(6) According to the sixth aspect of the invention, a light emitting device comprises:
- a phosphor frame that opens in the optical axis of light emitting element; and
- the light emitting element that is fixed in the phosphor frame;
- wherein the phosphor frame is composed of phosphor particles and transparent inorganic binding layer, and the phosphor particles are substantially connected each other in the phosphor frame.

(7) According to the seventh aspect of the invention, a light emitting device comprises:
- a light emitting element; and
- a phosphor layer that radiates fluorescent light while being excited by light emitted from the light emitting element;
- wherein the phosphor layer is composed of phosphor particles and transparent inorganic binding layer to be formed between the neighboring phosphor particles.

(8) According to the eighth aspect of the invention, a light emitting device comprises:
- a light emitting element; and
- a phosphor layer that radiates fluorescent light while being excited by light emitted from the light emitting element;
- wherein the phosphor layer is composed of phosphor particles and transparent inorganic binding layer to be formed between the neighboring phosphor particles, and the phosphor particles are filled to be substantially connected with each other in the phosphor layer.

(9) According to the ninth aspect of the invention, a phosphor layer for light emitting element comprises:
- phosphor particles; and
- transparent inorganic binding layer to be formed between the neighboring phosphor particles;
- wherein the phosphor particles are filled to be substantially connected with each other in the phosphor layer.

(10) According to the tenth aspect of the invention, a phosphor layer for light emitting element comprises;
- phosphor particles; and
- transparent inorganic binding layer to be formed between the neighboring phosphor particles;
- wherein a space is formed between the phosphor particles.

(11) According to the eleventh aspect of the invention, a method of forming a phosphor layer for light emitting device comprises the steps of:
- preparing phosphor layer precursor material by mixing inorganic-coating forming liquid and phosphor particles; and
- thermally treating the phosphor layer precursor material.

(12) According to the twelfth aspect of the invention, a light emitting device comprises:
- a light emitting element; and
- a phosphor layer that radiates fluorescent light while being excited by light emitted from the light emitting element;
- wherein the phosphor layer is formed by thermally treating phosphor layer precursor material that inorganic-coating forming liquid and phosphor particles are mixed.

(13) According to the thirteenth aspect of the invention, 31. A light emitting device, comprising:
- a light emitting element; and
- a molded phosphor layer that is of inorganic material molded.

In the light emitting device thus composed, the phosphor layer is formed such that, without dispersing the phosphor particles in dispersing agent, the phosphor particles are substantially connected through the thin transparent inorganic binding layer.

Thereby, the phosphor particles are homogeneously and densely filled in the phosphor layer and the amount of phosphor per unit volume can be maximized. Therefore, sufficient fluorescent light can be taken out even when using a thin phosphor layer. Thus, the degradation of phosphor and the occurrence of unevenness in emission color can be prevented simultaneously.

BRIEF DESCRIPTION OF THE DRAWINGS

The preferred embodiments according to the invention will be explained below referring to the drawings, wherein:

FIG. 19 is a cross sectional view showing part of modification 1 of the fifth embodiment;

DETAILED DESCRIPTION OF THE PREFERRED EMBODIMENTS

Figure 1:
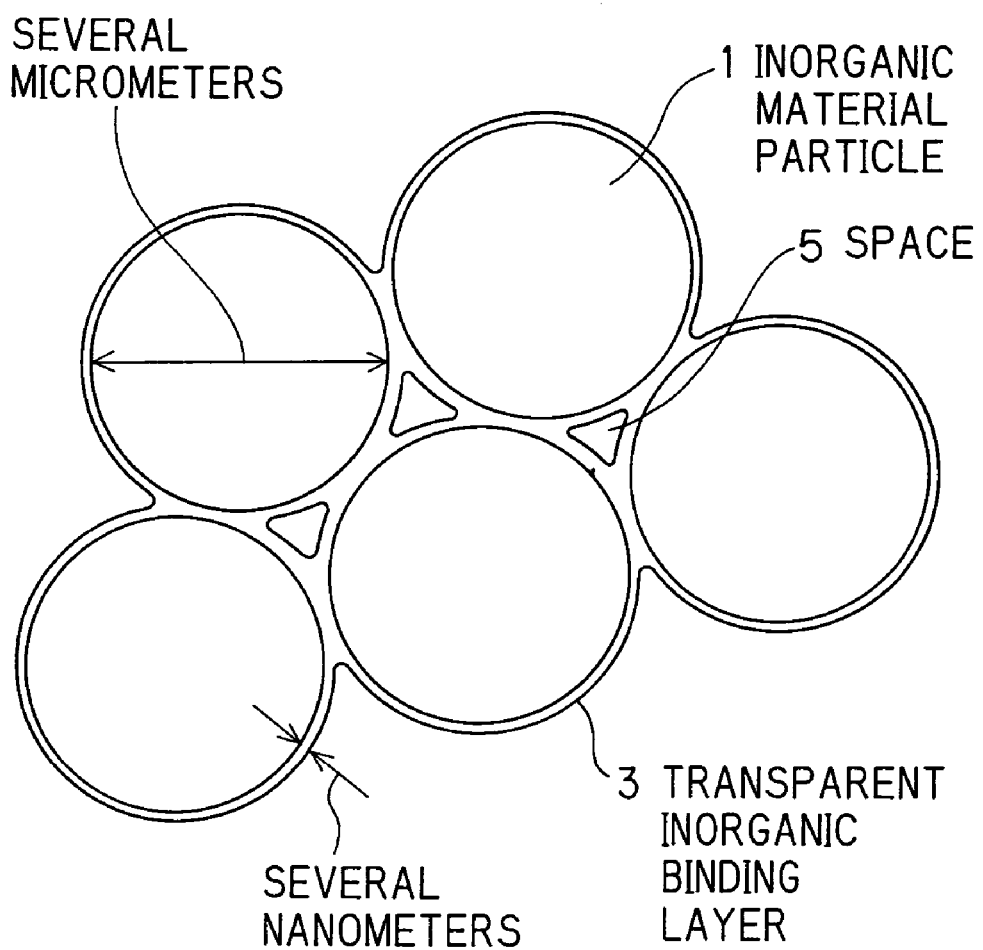
FIG. 1 is an illustration showing the structure of adhesion layer obtained according to the invention.

First of all, the components of a light emitting device of the invention are detailed below.

[Light Emitting Element]

The light emitting element includes a light emitting diode, a laser diode or the like. The emission wavelength of light emitting element is not specifically limited. A III group nitride system compound semiconductor element effective for emitting ultraviolet light to green system light or a GaAs system semiconductor element effective for emitting red system light can be used.

A light emitting element used for emitting ultraviolet light in the embodiments is III group nitride system compound semiconductor light emitting element. Available III group nitride system compound semiconductors for the III group nitride system compound semiconductor light emitting element are represented by a general formula: $Al_XGa_YIn_{1-X-Y}N$ ($0<X\leq1$, $0\leq Y\leq1$, $0\leq X+Y\leq1$). Those composed of Al include two-element system such as AlN, and three-element system such as $Al_{X1}Ga_{1-X1}N$ and $Al_{X1}In_{1-X1}N$ ($0<x1<1$). In the III group nitride system compound semiconductors and Gam, at least part of III group element may be replaced by boron (B), thallium (Tl) etc. and at least part of nitrogen (N) may be replaced by phosphorous (P), arsenic (As), antimony (Sb), bismuth (Bi) etc.

The III group nitride system compound semiconductor may include an arbitrary dopant (impurity). n-type impurity available is silicon (Si), germanium (Ge), selenium (Se), tellurium (Te), carbon (C) etc. p-type impurity available is magnesium (Mg), zinc (Zn), beryllium (Be), calcium (Ca), strontium (Sr), barium (Ba) etc. After doping p-type impurity, the III group nitride system compound semiconductor can be treated by a known method such as electron beam radiation, annealing and plasma radiation to lower the resistivity, but this treatment is not needed necessarily.

III group nitride system compound semiconductor layer can be formed by MOCVD (metal organic chemical vapor deposition). It is not always necessary to form all semiconductor layers to compose the light emitting element by MOCVD. Instead of MOCVD, molecular beam epitaxy (MBE), hydride vapor phase epitaxy (HVPE), sputtering, ion plating, electron shower etc. may be used.

The light emitting element may include MIS junction, PIN junction or pn-junction included homo-structure, hetero-structure or double hetero-structure. Light emitting layer thereof may include quantum well structure (single quantum well structure or multi-quantum well structure). The III group nitride system compound semiconductor light emitting element may be of a face-up type that main light emission direction (electrode surface) is in the optical axis direction of light emitting device or a flip-chip type that main light emission direction is in the opposite direction to the optical axis direction to use reflected light.

[Inorganic Material Particle]

The inorganic material particle only has to have a high thermal conductivity. It is preferably a powdered material of diamond, aluminum nitride, alumina, silica, magnesium oxide, titanium oxide etc. It is more preferably diamond with a high thermal conductivity.

The shape of inorganic material particle is not specifically limited. Although the diameter thereof is not specifically limited, it is preferably several hundreds of nanometers to several tens of micrometers. Several kinds of inorganic material particles may be used together.

[Phosphor Particle]

The phosphor particle may be a phosphor generally used in light emitting device, such as YAG phosphor used for blue system light emitting element.

For example, inorganic phosphors available areas follows. Those with red system emission color includes: $6MgO.As_2O_5:Mn^{4+}Y(PV)O_4:Eu$; $CaLa_{0.1}Eu_{0.9}Ga_3O_7$; $BaY_{0.9}Sm_{0.1}Ga_3O_y$; $Ca(Y_{0.5}Eu_{0.5})(Ga_{0.5}In_{0.5})_3O_7$; $Y_3O_3$: Eu; $Y_2O_2$:Eu; $Y_2O_2$:Eu; $3.5MgO.0.5MgF_2GeO_2:Mn^{6+}$; and (Y.Cd)$BO_2$:Eu etc. Those with blue system emission color includes: (Ba, Ca, Mg)$_5$(PO$_4$)$_3$Cl:Eu$^{2+}$; (Ba, Mg)$_2$Al$_{16}$O$_{27}$:Eu$^{2+}$; Ba$_3$MgSi$_2$O$_8$:Eu$^{2+}$; BaMg$_2$Al$_{16}$O$_{27}$:Eu$^{2+}$; (Sr, Ca)$_{10}$(PO$_4$)$_6$Cl$_2$:Eu$^{2+}$; (Sr, Ca)$_{10}$(PO$_4$)$_6$Cl$_2$.nB$_2$O$_3$:Eu$^{2+}$; Sr$_{10}$(PO$_4$)$_6$Cl$_2$:Eu$^{2+}$; (Sr, Ba, Ca)$_5$(PO$_4$)$_3$Cl:Eu$^{2-}$; Sr$_2$P$_2$O$_7$:Eu; Sr$_5$(PO$_4$)$_3$Cl:Eu; (Sr, Ca, Ba)$_3$(PO$_4$)$_6$Cl:Eu; SrO.P$_2$O$_5$.B$_2$O$_5$: Eu; (Ba Ca)$_5$(PO$_4$)$_3$Cl:Eu; SrLa$_{0.95}$Tm$_{0.05}$Ga$_2$O$_7$; Zns:Ag; GaWO$_4$; Y$_2$SiO$_6$:Ce; ZnS:Ag, Ga, Cl; Ca$_2$Ba$_4$OCl:Eu$^2$; BaMgAl$_4$O$_3$:Eu$^{2+}$; and a phosphor represented by a general formula: (Ml, Eu)$_{10}$(PO$_6$)$_6$Cl$_2$, where Ml is at least one element selected from the group of Mg, Ca, Sr and Ba) etc. Those with green system emission color includes: Y$_3$Al$_5$O$_{12}$:Ce$^{3-}$ (YAG); Y$_2$SiO$_5$:Ce$^{3+}$, Tb$^{3+}$; Sr$_2$Si$_3$O$_8$.2SrCl$_2$:Eu; BaMg$_2$Al$_{16}$O$_{27}$:Eu$^{2+}$, ZnSiO$_4$:Mn; Zn$_2$SiO$_4$:Mn; LaPO$_4$:Tb; SrAl$_2$O$_4$:Eu; SrLa$_{0.2}$Tb$_{0.8}$Ga$_3$O$_7$; CaY$_{0.9}$Pr0.1, Ga$_3$O$_7$; ZnGd$_{0.8}$ Ho$_{0.2}$Ga$_3$O$_7$; srLa$_{0.6}$Tb$_{0.4}$Al$_3$O$_7$; ZnS:Cu, Al; (Zn, Cd)S:Cu, Al; ZnS:Cu, Au, Al; Zn$_2$SiO$_4$:Mn; ZnSiO$_4$:Mn; ZnS:Ag, Cu; (Zn.Cd)S:Cu; ZnS:Cu; GdOS:Tb; LaOS:Tb; YSiO$_4$:Ce.Tb; ZnGeO$_4$:Mn; GeMgAlO:Tb; SrGaS:Eu$^{2-}$; ZnS:Cu.Co; MgO.nB$_2$O$_3$:Ge, Tb; LaOBr:Tb, Tm; and La$_2$O$_2$S:Tb etc. Those with white system emission color includes: YV$_4$:Dy. Those with yellow system emission color includes: CaLu$_{0.5}$Dy$_{0.5}$Ga$_3$O$_7$.

When light emitted from the light emitting element has so-called an ultraviolet wavelength of 400 nm or less, available is any one or a combination of two or more selected from phosphors; ZnS:Cu, Al; (Zn, Cd)S:Cu, Al; ZnS:Cu, Au. Al; Y$_2$SiO$_5$:Tb; (Zn, Cd)S:Cu; Gd$_2$O$_2$S:Tb; Y$_2$O$_2$S:Tb; Y$_3$Al$_5$O$_{12}$:Ce; (Zn, Cd)S:Ag; ZnS:Ag, Cu, Ga, Cl; Y$_3$Al$_5$O$_{12}$: Tb; Y$_3$(Al, Ga)$_5$O$_{12}$:Tb; Zn$_2$SiO$_4$:Mn; LaPO$_4$:Ce, Tb; Y$_2$O$_3$S:Eu; YVO$_4$:Eu; ZnS:Mn; Y$_2$O$_3$:Eu; ZnS:Ag, ZnS:Ag, Al; (Sr, Ca, Ba, Mg)$_{10}$(PO$_4$)$_6$Cl$_2$:Eu; Sr$_{10}$(PO$_4$)$_6$Cl$_2$:Eu; (Ba, Sr, Eu) (Mg, Mn)Al$_{10}$O$_{17}$; (Ba, Eu)MgAl$_{10}$O$_{17}$; ZnO:Zn; and Y$_2$SiO$_5$:Ce.

Two or more of different kinds of phosphors may be combined.

A second phosphor may radiate light with a third wavelength by absorbing light emitted from the light emitting element or light emitted from a first phosphor.

A light diffusion material can be used together with the phosphor. Thereby, unevenness in emission can be reduced.

[Transparent Inorganic Binding Layer]

Figure 11:
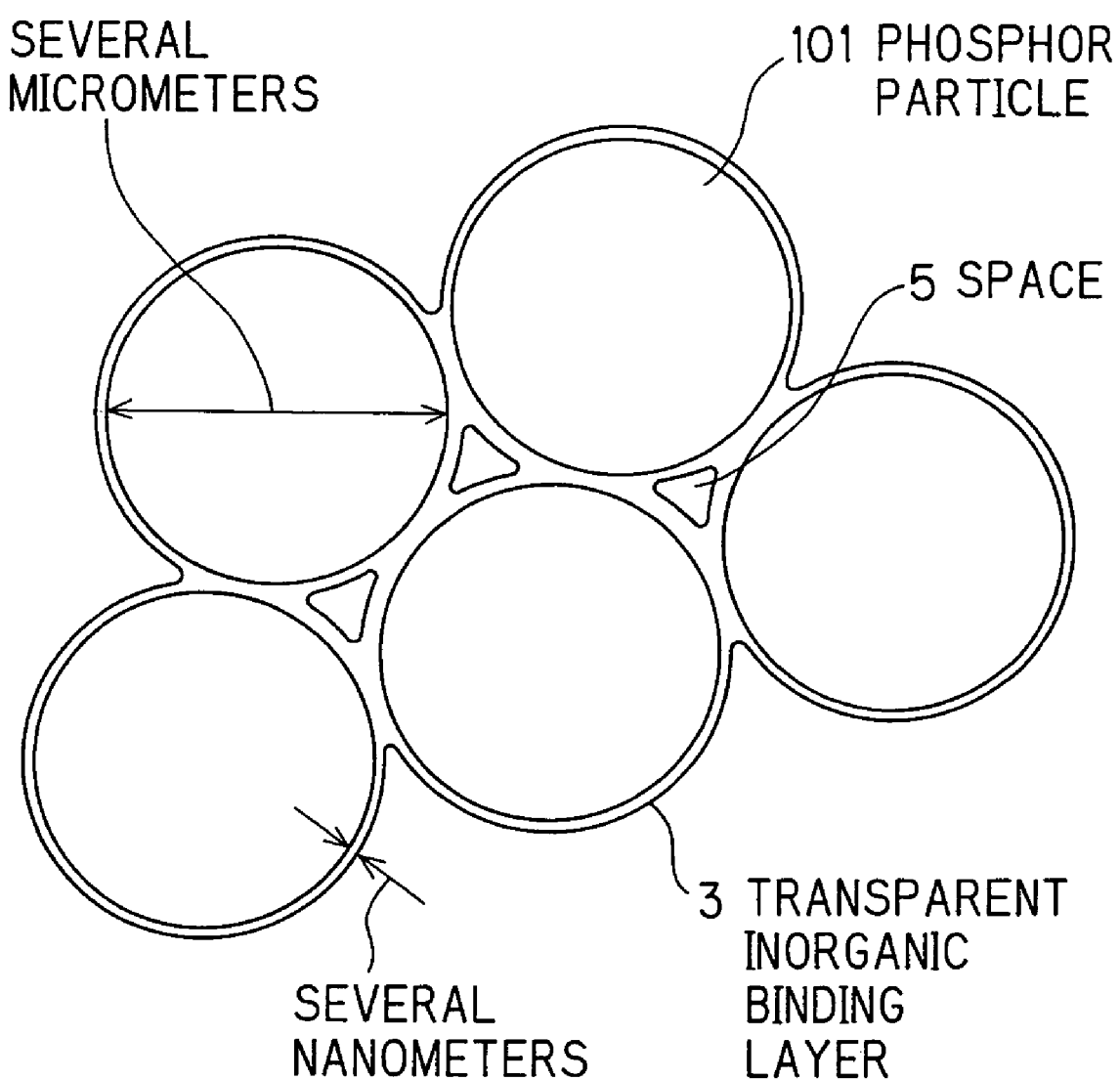
FIG. 11 is an illustration showing the structure of phosphor layer obtained according to the invention.

The transparent inorganic binding layer is of an inorganic material to combine inorganic material particles (or phosphor particles) together. Conventionally, transparent resin or low melting point glass was used as a dispersing agent for inorganic material particles (or phosphor particles), i.e., inorganic filler. However, the transparent inorganic binding layer of the invention does not serve as a dispersing agent for inorganic material particles (or phosphor particles). This is because a volume occupied by transparent inorganic binding layer in adhesion layer (or phosphor layer) is extremely smaller than that occupied by inorganic material particles (or phosphor particles) therein. As shown in FIG. 1 (or FIG. 11), the thickness of transparent inorganic binding layer 3 to cover an inorganic material particle 1 (or phosphor particle 101) is several nanometers, whereas the average diameter of inorganic material particle 1 (or phosphor particle 101) is several micrometers. In other words, inorganic material particles 1 (or phosphor particles 101) with a diameter of about thousand times the thickness of transparent inorganic binding layer 3 are bound together through the very thin layer 3 with a thickness of several nanometers.

It is preferable that the transparent inorganic binding layer 3 has a smaller thickness than the average diameter of inorganic material particle 1 (or phosphor particle 101) to be equally and densely filled with the inorganic material particles (or phosphor particles 101).

It is impossible to sufficiently fill between inorganic material particles with such a thinned transparent inorganic binding layer 3. Thus, spaces 5 are generated between the inorganic material particles 1 and, therefore, the adhesion layer of the invention becomes porous. In general, with such a porous adhesion layer, the thermal conduction will be reduced. However, since the transparent inorganic binding layer of the invention is so thin that the inorganic material particles are substantially connected with each other, the thermal conductivity can be enhanced contrariwise.

On the other hand, when the inorganic material particles are densely filled through the transparent inorganic binding layer 3, light emitted from the light emitting element and light radiated from the phosphor particles 101 are diffusely reflected by the space 5. Therefore, both lights can be efficiently mixed even with a thin phosphor layer to obtain light with desired color such as white.

The transparent inorganic binding layer can be formed using inorganic-coating forming liquid. The inorganic-coating forming liquid may be, for example, liquid used to form a protection film of semiconductor substrate. Such inorganic-coating forming liquid is coated on the semiconductor substrate and then, by baking after drying, is formed into thin film (protection film) to closely contact the semiconductor substrate. Such inorganic-coating forming liquid is not specifically limited if it has a low viscosity and can be homogeneously mixed with inorganic material particles (or phosphor particles), forming thin film around the inorganic material particles (phosphor particles), thereby combining them each other and being securely bonded to the mount member and light emitting element.

For example, the inorganic-coating forming liquid may be composed of a mixture of the hydrolysate and the hydrolysis/condensation polymer of an alkoxide compound represented by general formula: $M^{a+}(OR^1)_m R^2_{a-m}$, where M includes any one of Si, Al, Zr and Ti, $R^1$ is hydrocarbon group with a carbon number of 1 to 5, alokoxyalkyl group or acyl group, $R^2$ is an organic group including at least one selected from vinyl, amino, imino, epoxy, acryloyloxy, methacryloyloxy, phenyl, mercapto and alkyl groups, a is a valance of M, and a and m are integers.

The hydrolysis and condensation polymerization of alkoxide compound represented by general formula: $M^{a+}(OR^1)_m R^2_{a-m}$ is performed as follows.

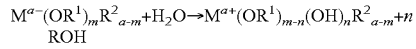

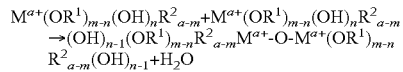

The inorganic-coating forming liquid of the invention is a mixture of the hydrolysate and the hydrolysis/condensation polymer of an alkoxide compound mentioned above, and has fluidity equal to that of water.

When metal element, M is Si in the general formula, silane compounds available are as follows: vinyltrimethoxysilane, vinyltriethoxysilane; vinyltriacetoxysilane; γ-aminopropyltrimethoxysilane, γ-glicidoxypropyltrimethoxysilane, γ-glicidoxypropyltriethoxysilane, β-(3,4-epoxycyclohexyl)ethyltrimethoxysilane, γ-(3,4-epoxycyclohexyl)ethyltriethoxysilane, γ-(metha)acryloxypropyltrimethoxysilane, phenyltrimethoxysilane, phenyltriacetoxysilane, γ-mercaptopropyltrimethoxysilane, γ-chloropropyltrimethoxysilane, β-cyanoethyltriethoxysilane, methyltrimethoxysilane, methyltriethoxysilane, methyltripropoxysilane, methyltributoxysilane, ethyltrimethoxysilane, ethyltriethoxysilane, tetramethoxysilane, tetraethoxysilane, tetrapropoxysilane, tetrabutoxysilane etc.

Known coating forming liquid such as polyimidesiloxane can be also used as the inorganic-coating forming liquid (Japanese patent application laid-open Nos. 11-110754, 9-183948). Tow or more kinds of inorganic-coating forming liquid as listed above can be used mixing together.

The application of adhesion layer precursor material and phosphor layer precursor material will be explained below.

(1) Adhesion Layer Precursor Material

The adhesion layer precursor material is obtained by mixing the inorganic-coating forming liquid and inorganic material particles. The adhesion layer precursor material is sol-formed and has high fluidity. Thereby, in mounting the light emitting element, the adhesion layer precursor material can be easily coated on the side and top surfaces of light emitting element. When an adhesion layer is given by hardening the adhesion layer precursor material, the adhesion layer with a high thermal conductivity contacts the light emitting element in wide area. Therefore, the heat radiation of light emitting element can be enhanced.

When the light emitting element is of flip-chip type, its electrode is bonded through a bump to a mounting member such as sub mount. In such a mounting structure, though there occurs a space between the electrode face of light emitting element and the mounting member, the adhesion layer precursor material of the invention can penetrate the space to fill there. Thereby, the heat radiation can be enhanced, the adhesion force in bump connection can be reinforced and the insulation in electrode face can be ensured.

The fluidity of adhesion layer precursor material can be controlled by adjusting the blend ratio of inorganic-coating forming liquid and inorganic material particles or by adding an auxiliary agent such as thickener.

The inorganic-coating forming liquid can be hardened at a relatively low temperature, thereby fixing the inorganic material particles and bonding the light emitting element to the mounting member. Silane compounds in the embodiments are hardened at around 200° C. In case of thermal treatment at around 500° C., most of organic components will be disassociated. Also, in the heating at higher than 500° C., bonding wires and its connection site are subjected to a load. Therefore, it is preferable that the heating temperature of inorganic-coating forming liquid is controlled lower than 500° C.

(2) Phosphor Layer Precursor Material

The phosphor layer precursor material is obtained by mixing the phosphor layer precursor material and phosphor particles. The phosphor layer precursor material is sol-formed and has high fluidity. Thereby, an arbitrary form of phosphor layer can be made using this. Directly coating the phosphor layer precursor material on the light emitting element, the entire light emitting element can be coated with this material. Further, the phosphor layer precursor material may be filled in a cup portion on which the light emitting element is mounted.

If the phosphor particles contain an alkaline earth metal element, the alkaline earth metal element may react with water to lower the efficiency of phosphor. Therefore, if the inorganic-coating forming liquid may contain moisture, it is necessary to remove moisture from the inorganic-coating forming liquid or phosphor layer precursor material before and/or after the mixing. The removal of moisture can be conducted by heating, vacuuming or using a drying agent.

The inorganic-coating forming liquid can be hardened at a relatively low temperature, thereby fixing the phosphor particles. Silane compounds in the embodiments are hardened at around 200° C. In case of thermal treatment at around 400° C., most of organic components will be disassociated. Also, in the heating at higher than 500° C., the phosphor may be denatured. Therefore, it is preferable that the heating temperature of inorganic-coating forming liquid is controlled lower than 500° C.

Further, the phosphor layer precursor material can be molded using its fluidity. For example, the phosphor layer precursor material is injected into a metal mold having a shape of phosphor layer. The light emitting element is covered with the phosphor layer thus molded. Thus, the phosphor layer can be formed into arbitrary shape at a high dimensional precision.

First Embodiment

Figure 2:
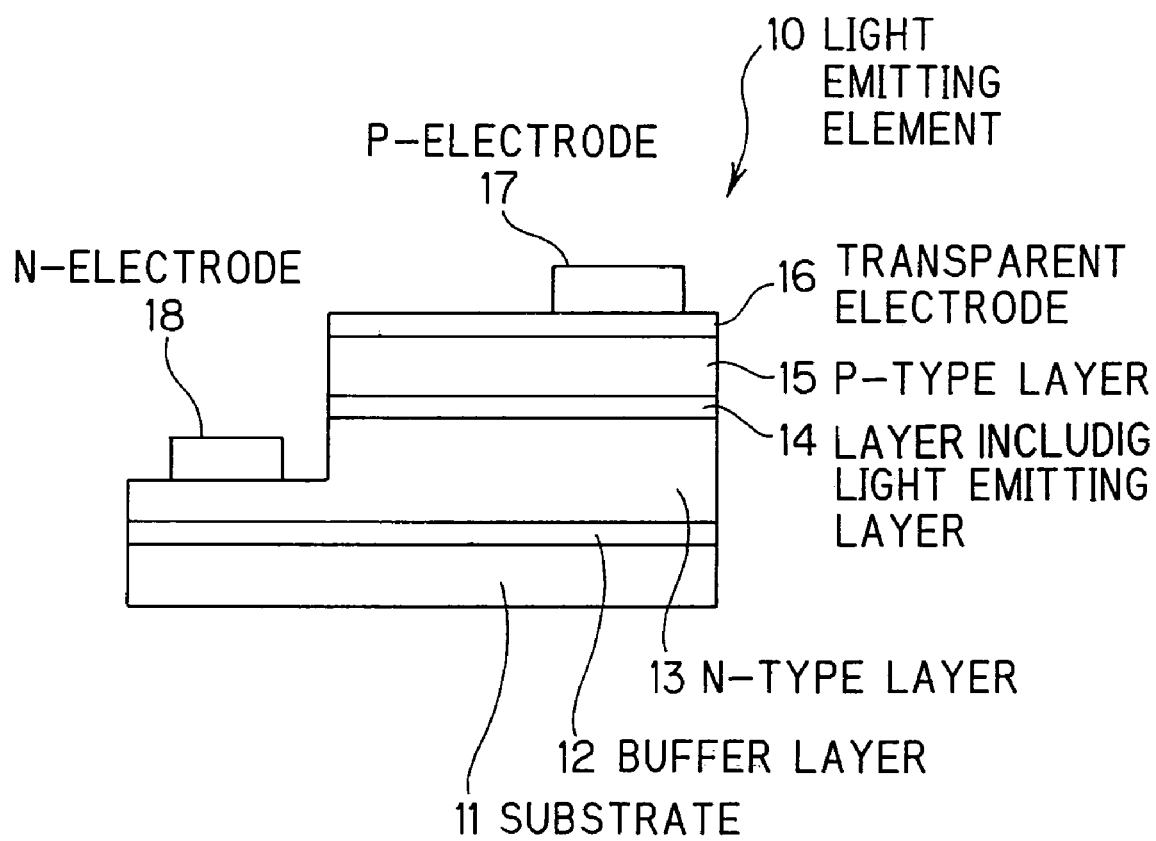
FIG. 2 is a cross sectional view showing a light emitting element 10 used in a light emitting device in a first preferred embodiment of the invention.

FIG. 2 is a cross sectional view showing a light emitting element 10 used in a light emitting device in the first preferred embodiment of the invention.

In this embodiment, a face-up type III group nitride system compound semiconductor light emitting element 10 as shown in FIG. 2 is used. The light emitting element 10 emits blue system light. The details of layers composing the light emitting element 10 are as follows:

| Layers | Composition |
|---|---|
| p-type layer 15 | p-GaN:Mg |
| layer 14 including light emitting layer | InGaN layer included |
| n-type layer 13 | n-GaN:Si |
| buffer layer 12 | AlN |
| substrate 11 | sapphire |

The emission wavelength of light emitting element 10 can be adjusted by controlling the composition ratio of III group element in layer 14 including light emitting layer. Alternatively, a flip-chip type light emitting element may be used that a thick p-electrode to cover the surface of p-type layer 15 is provided instead of a transparent electrode 16 and p-electrode 17.

n-type layer 13 of GaN with n-type impurity Si doped is grown through buffer layer 12 on the substrate 11. Although the substrate 11 is of sapphire in this embodiment, it may be, instead, of spinel, silicon carbide, zinc oxide, magnesium oxide, manganese oxide, zirconium boride or III group nitride system compound semiconductor single crystal etc. The buffer layer 12 of AlN is grown by MOCVD. It may be of GaN, InN, AlGaN, InGaN, AlGaInN etc. and may be grown by molecular beam epitaxy (MBE), hydride vapor phase epitaxy (HVPE), sputtering, ion plating etc. When the substrate 11 is of III group nitride system compound semiconductor, the buffer layer can be omitted.

Meanwhile, the substrate and buffer layer can be removed after forming the semiconductor element, when needed.

Although n-type layer 13 is of GaN, it may be of AlGaN, InGaN or AlInGaN.

Although n-type impurity Si is doped in the n-type layer 13, the other n-type impurity, e.g. Ge, Se, Te and C may be doped therein.

The layer 14 including light emitting layer can have quantum well structure (multiquantum well structure or single quantum well structure). The structure of light emitting element may be of single-hetero type, double-hetero type or homo junction type.

The layer 14 including light emitting layer may also include Mg-doped III group nitride system compound semiconductor layer with a large bandgap on the p-type layer 15 side. This prevents electrons injected into the layer 14 including light emitting layer from dispersing into the p-type layer 15.

p-type layer 15 of GaN with p-type impurity mg doped is grown on the layer 14 including light emitting layer. The p-type layer 15 may be of AlGaN, InGaN or AlInGaN. P-type impurity may be Zn, Be, Ca, Sr or Ba. After doping p-type impurity, the layer 15 can be treated by a known method such as electron beam radiation, annealing and plasma radiation to lower the resistivity, but this treatment is not needed necessarily.

In this embodiment, the III group nitride system compound semiconductor layer is grown, under general conditions, by MOCVD, molecular beam epitaxy (MBE), hydride vapor phase epitaxy (HVPE), sputtering, ion plating etc.

n-type electrode 18 is composed of two layers of Al and V. After growing the p-type layer 15, part of the p-type layer 15, layer 14 including light emitting layer and n-type layer 13 is removed by etching, then forming the n-type electrode 18 on exposed n-type layer 13 by vapor deposition.

Transparent electrode 16 formed on the p-type layer 15 is thin film including gold. Also, p-type electrode 17 formed on the transparent electrode 17 by vapor deposition is of material including gold.

After forming the layers and electrodes as described above, the wafer is separated into chips.

Adhesion layer precursor material is prepared as next.

At first, agitating a mixture of γ-glycidoxypropyltrimethoxysilane of 70.71 g, water of 32.32 g and isopropylcellosolve of 56.97 g at room temperature in a beaker of 200 ml for one hour, inorganic-coating forming liquid is obtained.

Adding diamond particles (average particle diameter of 3 μm) of 61.0 g to inorganic-coating forming liquid, dispersing it in a ball mill pot, adhesion layer precursor material is obtained.

Baking the adhesion layer precursor material at 400° C. for 10 min, the inorganic-coating forming liquid is hardened to have thin transparent inorganic binding layer to cover the diamond particles. Thereby, the diamond particles are bonded to each other.

Figure 3:
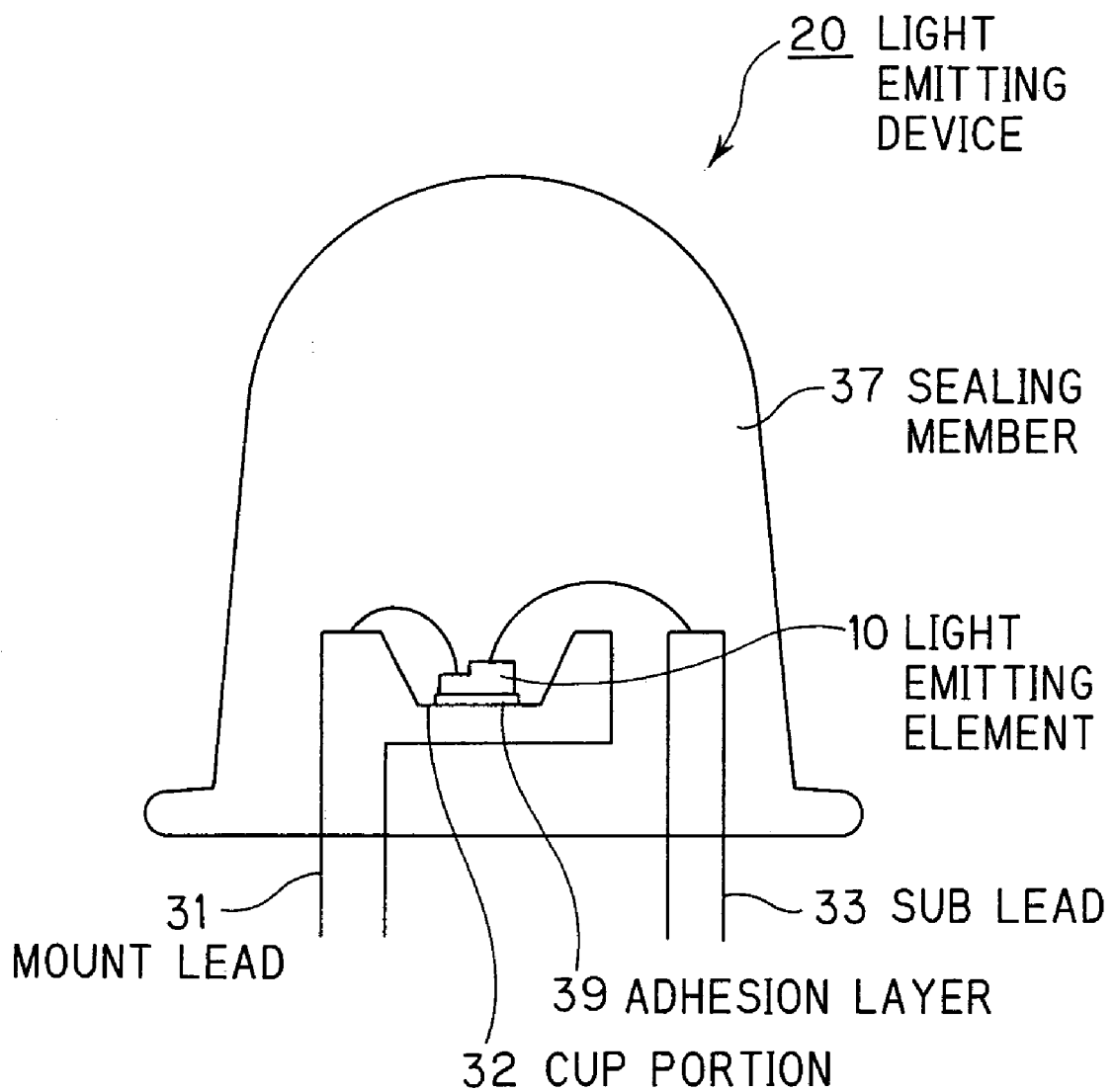
FIG. 3 is a cross sectional view showing the light emitting device 20 in the first preferred embodiment of the invention.
Figure 4:
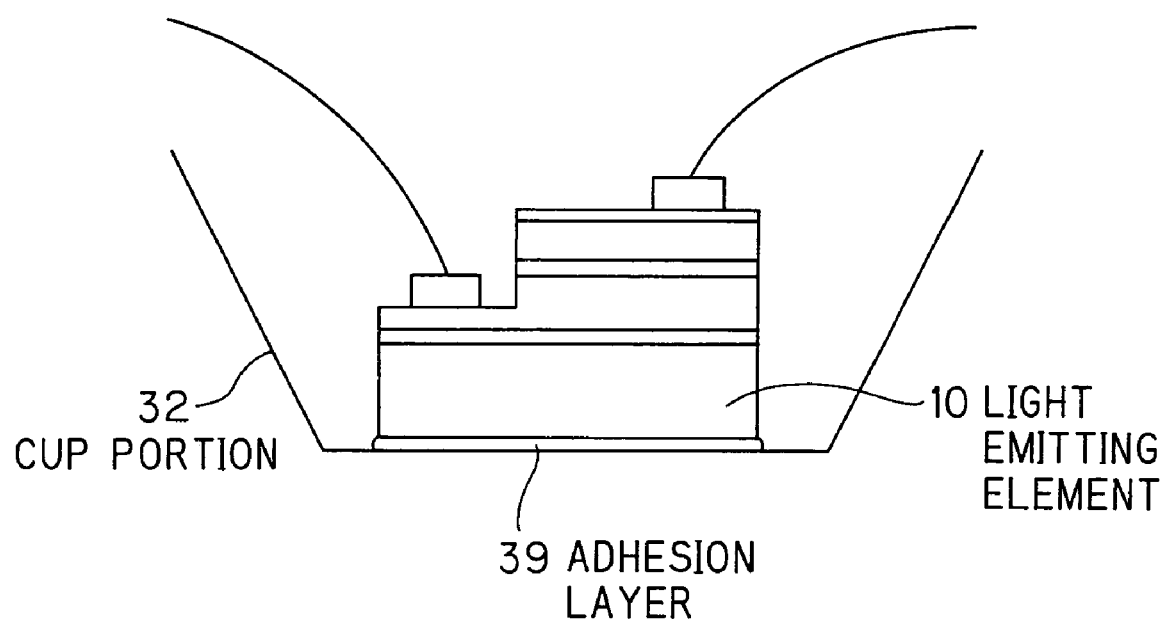
FIG. 4 is an enlarged cross sectional view shoving adhesion layer in FIG. 3.

FIG. 3 is a cross sectional view showing the light emitting device 20 in the first preferred embodiment of the invention. FIG. 4 is an enlarged cross sectional view showing adhesion layer in FIG. 3.

In this embodiment, the substrate surface of light emitting element 10 is bonded to the bottom of cup potion 32 of mount lead 31. The mount lead 31 and sub lead 33 are sealed by sealing member 37 with a shape of lamp type.

In bonding the light emitting element 10 to the cup portion 32, at first, the adhesion layer precursor material is laid therebetween. Then, thermally treating at 400° C. for 10 min., the adhesion layer precursor material is changed to adhesion layer 39 to securely bond the light emitting element 10 to the cup portion 32 (See FIG. 4).

In the adhesion layer 39, diamond particles 1 are nearly in state of continuity (See FIG. 1). Thus, the adhesion layer 39 can enjoy a good heat radiation property.

Figure 5:
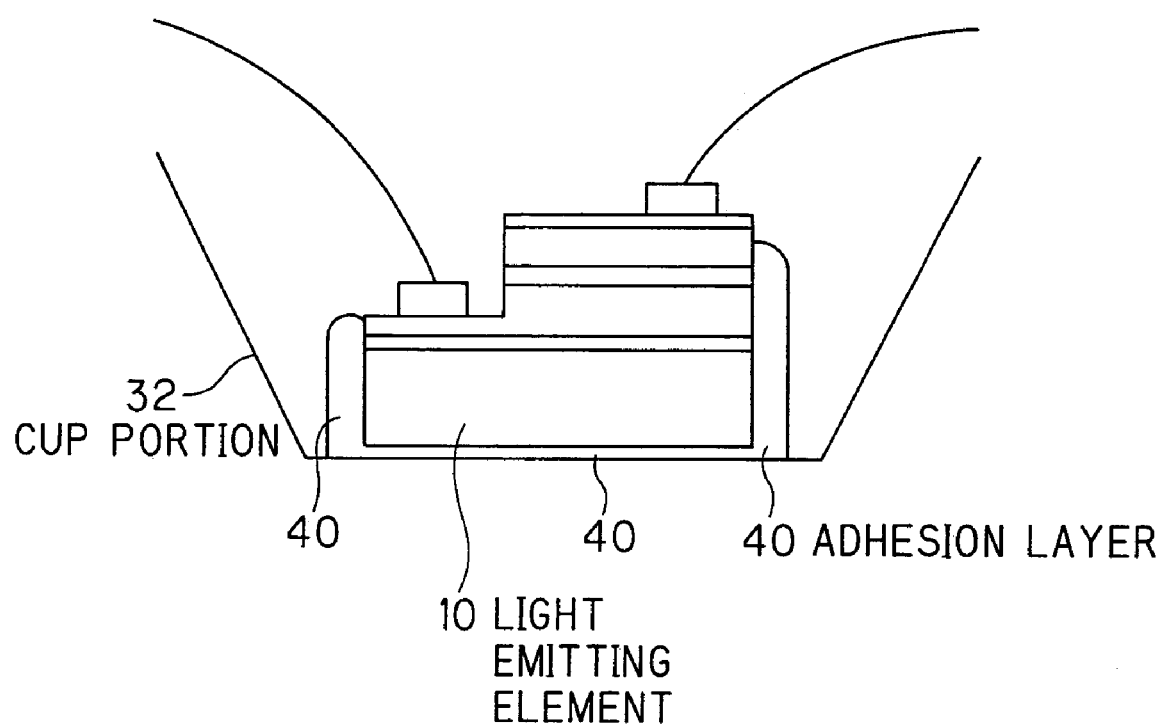
FIG. 5 is a cross sectional view showing modification 1 of the first embodiment.

FIG. 5 is a cross sectional view showing modification 1 of the first embodiment. In this modification, adhesion layer 40 is formed extending to the side of light emitting element 10. Due to a high thermal conductivity of the adhesion layer 40, the greater the contact area with the light emitting element 10 is, the more heat can be radiated outside from the light emitting element 10. Since the light emitting element 10 generates heat especially in light emitting layer, it is preferable that the adhesion layer 40 is formed extending to the region of light emitting layer.

Figure 6:
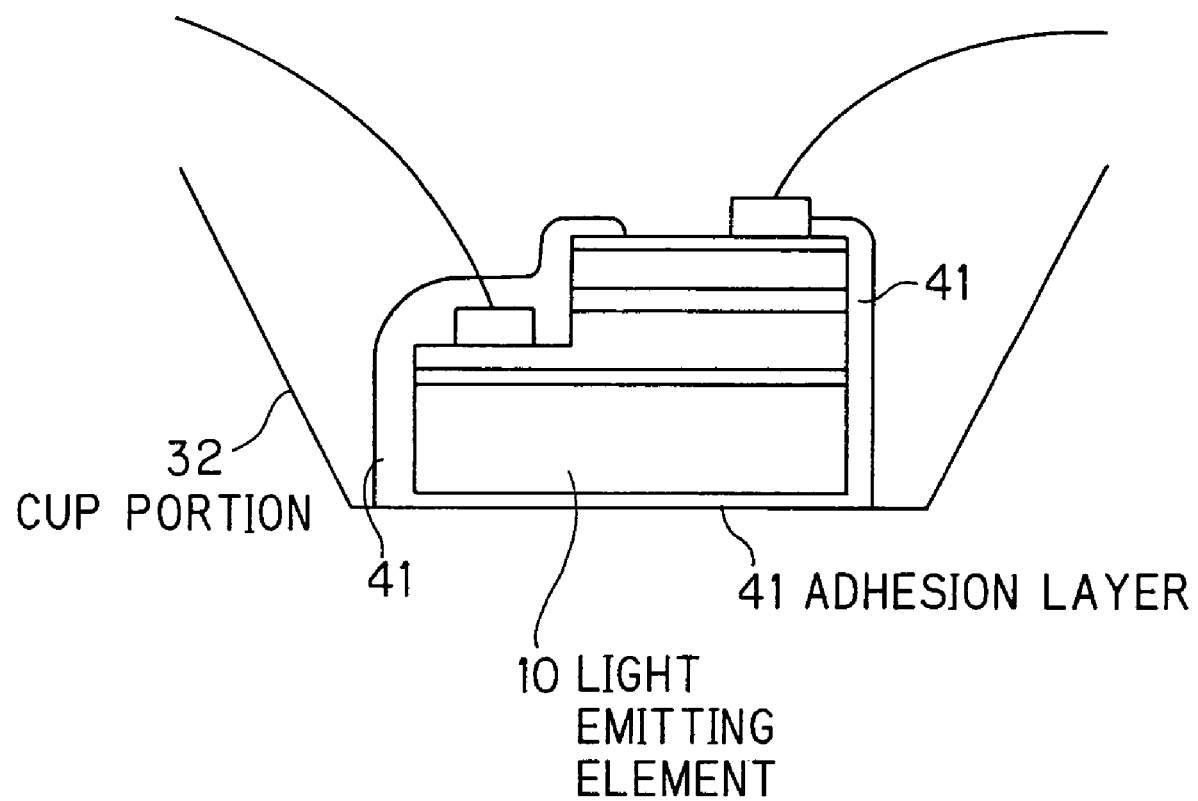
FIG. 6 is a cross sectional view showing modification 2 of the first embodiment.
Figure 7:
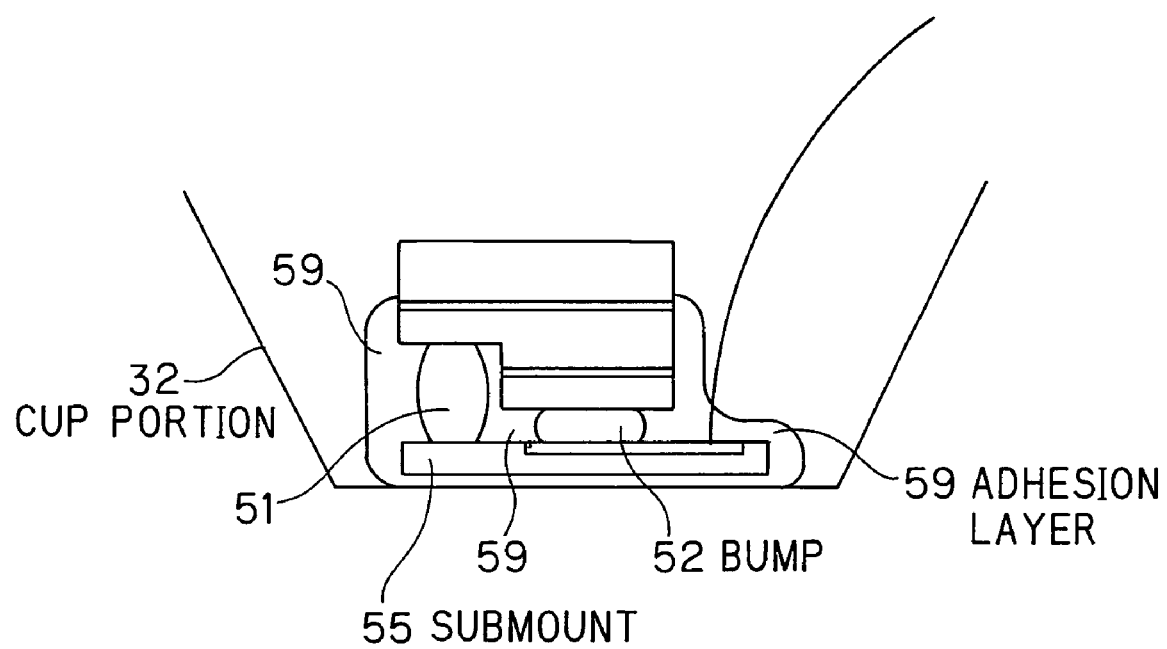
FIG. 7 is a cross sectional view showing modification 3 of the first embodiment.

FIG. 6 is a cross sectional view showing modification 2 of the first embodiment. In this modification, adhesion layer 41 is formed extending to the top surface of light emitting element 10. Since the adhesion layer 41 has an insulative property, leakage current on the surface of light emitting element 10 can be prevented.

FIG. 6 is a cross sectional view showing modification 3 of the first embodiment. In this modification, a flip-chip type light emitting element 50 is used. The flip-chip type light emitting element 50 is composed such that, in the face-up type shown in FIG. 2, a thick p-electrode covering the surface of p-type layer is formed instead of the transparent electrode 16 and pad-like p-electrode 17. The light emitting element 50 is bonded through bumps 51, 52 to a submount 55, and the submount 55 is bonded to the cup portion 32.

In modification 3, the adhesion layer precursor material is filled in a clearance between the light emitting element 50 and submount 55. Since the adhesion layer precursor material has a high fluidity, it can be embedded in the clearance while leaving no space therebetween. Hardening the adhesion layer precursor material, an adhesion layer 59 of inorganic material with a good thermal conductivity is obtained. Due to the adhesion layer 59, the heat radiation property can be enhanced and the leakage current on electrode surface can be prevented. Also, the adhesion layer 59 can reinforce the adhesive force of bumps 51 and 52.

Second Embodiment

In the second embodiment, the light emitting device shown in FIGS. 4, 5, 6 and 7 use phosphor particles as the inorganic material particles in the adhesion layer 39, 40, 41 or 59.

In detail, phosphor layer precursor material is prepared as follows.

At first, agitating a mixture of γglycidoxypropyltrimethoxysilane of 70.71 g, water of 32.33 g and isopropylcellosolve of 54.97 g at room temperature in a beaker of 200 ml for one hour, inorganic-coating forming liquid is obtained.

Adding YAG system phosphor particles (average particle diameter of 3 μm) of 61.0 g to inorganic-coating forming liquid, dispersing it in a ball mill pot for three hours, the phosphor layer precursor material is obtained.

Baking the phosphor layer precursor material at 400° C. for 10 min while providing it between the light emitting element and cup portion, the inorganic-coating forming liquid is hardened to have thin transparent inorganic binding layer to cover the phosphor particles. Thereby, the phosphor particles are bonded to each other and the light emitting element is bonded to the cup portion through inorganic-coating forming liquid.

Third Embodiment

Figure 8:
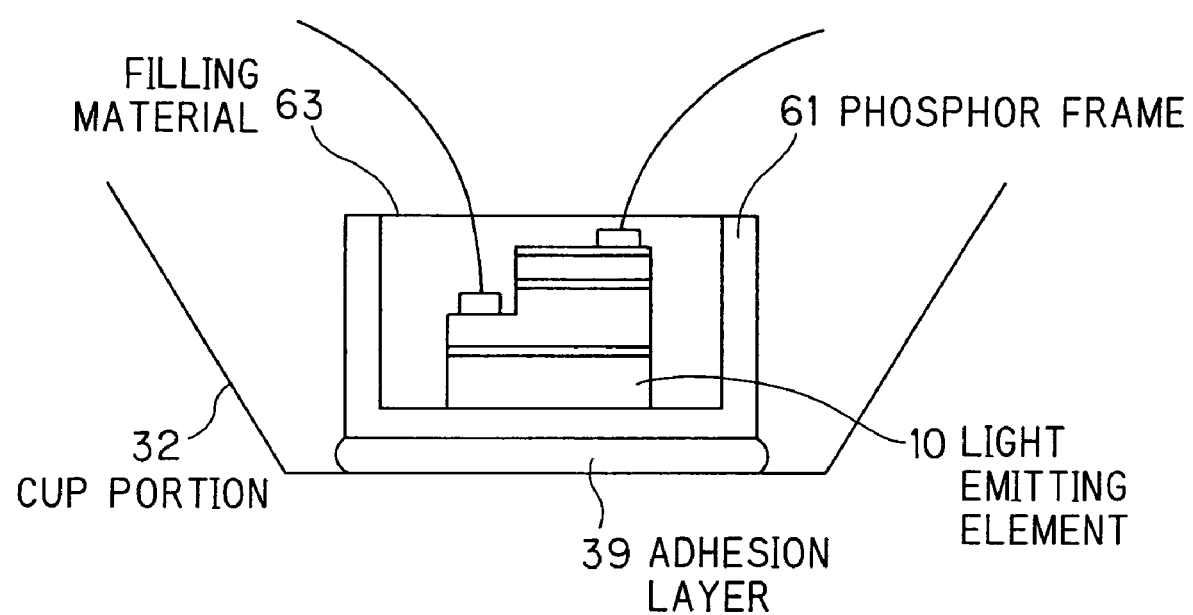
FIG. 8 is a cross sectional view showing a light emitting device in a third preferred embodiment of the invention.

FIG. 8 is a cross sectional view showing a light emitting device in the third preferred embodiment of the invention. Like components are indicated same numerals used in FIG. 4 (first embodiment).

The light emitting device has a phosphor frame 61 that opens in the optical axis direction, and the light emitting elements mounted in the phosphor frame 61. The phosphor frame 61 is made by molding the phosphor layer precursor material in the second embodiment. The shape of phosphor frame 61 can be designed arbitrarily according to the use of light emitting element. Filling material 63 is filled within the phosphor frame 61. The filling material 63 is prepared by dispersing phosphor particles, which are the same as those included in the adhesion layer, into transparent material. Filling the phosphor layer precursor material used in the second embodiment within the phosphor frame 61 and hardening it by thermal treatment, the filling material 63 may be formed.

Figure 9:
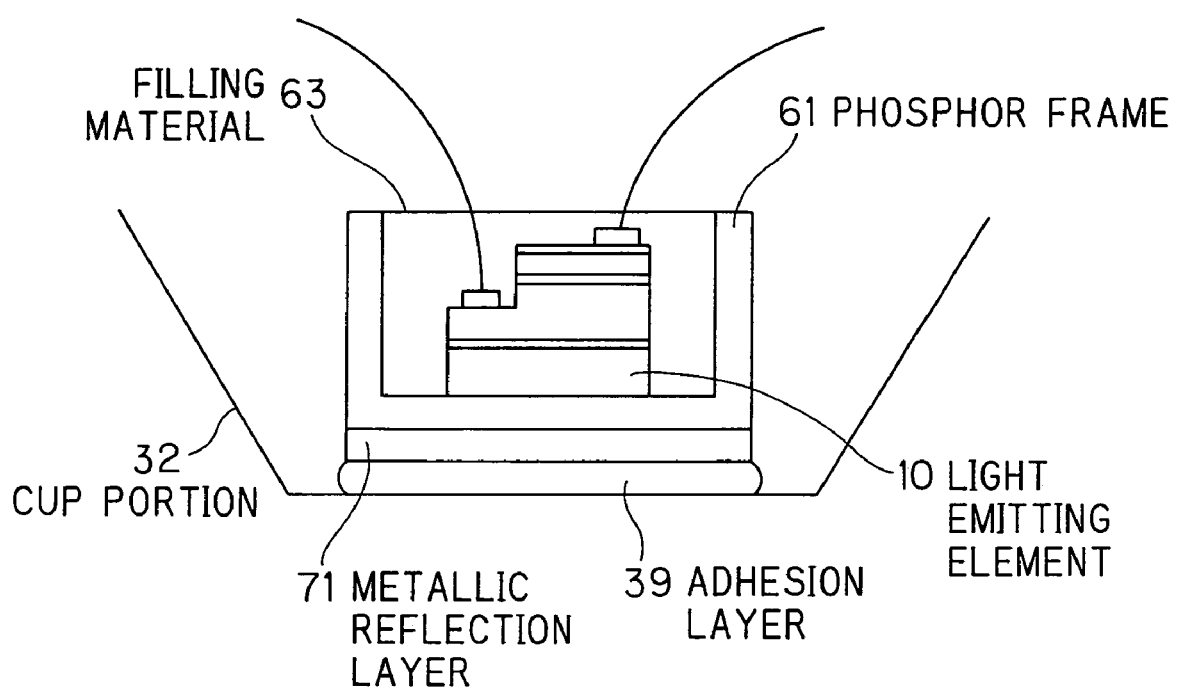
FIG. 9 is a cross sectional view showing modification 1 of the third embodiment.

FIG. 9 is a cross sectional view showing modification 1 of the third embodiment. In modification 1, a metallic reflection layer 71 is formed under the phosphor frame 61. Thereby, light to be radiated downward from the light emitting element 10 and phosphor frame 61 is reflected in the optical axis direction. So, the light extraction efficiency of light emitting device can be enhanced.

Figure 10:
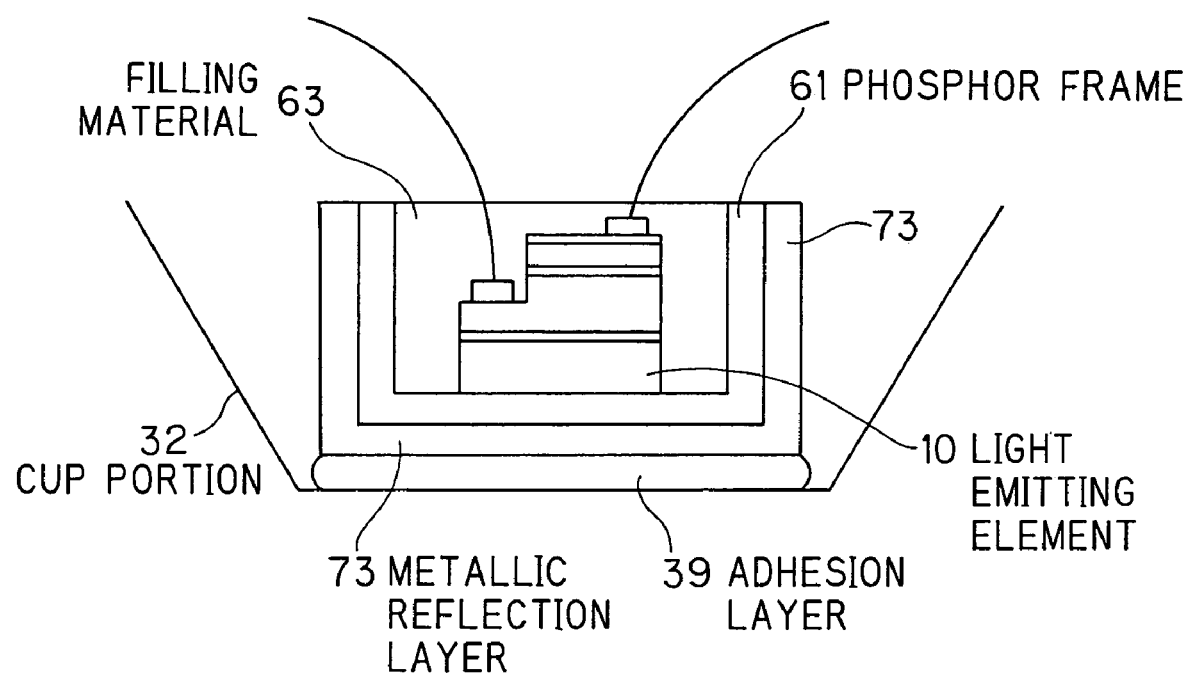
FIG. 10 is a cross sectional view showing modification 2 of the third embodiment.

FIG. 10 is a cross sectional view showing modification 2 of the third embodiment. In modification 2, metallic reflection layer 73 is formed around all the outer surfaces of phosphor frame 61. Thereby, light to be radiated downward and sideward from the light emitting element 10 and phosphor frame 61 is reflected by the metallic reflection layer 73. So, the light extraction efficiency of light emitting device can be further enhanced.

Meanwhile, in FIGS. 9 and 10, like components are indicated by same numerals used in the previous embodiment and explanation thereof is omitted.

Fourth Embodiment

Figure 12:
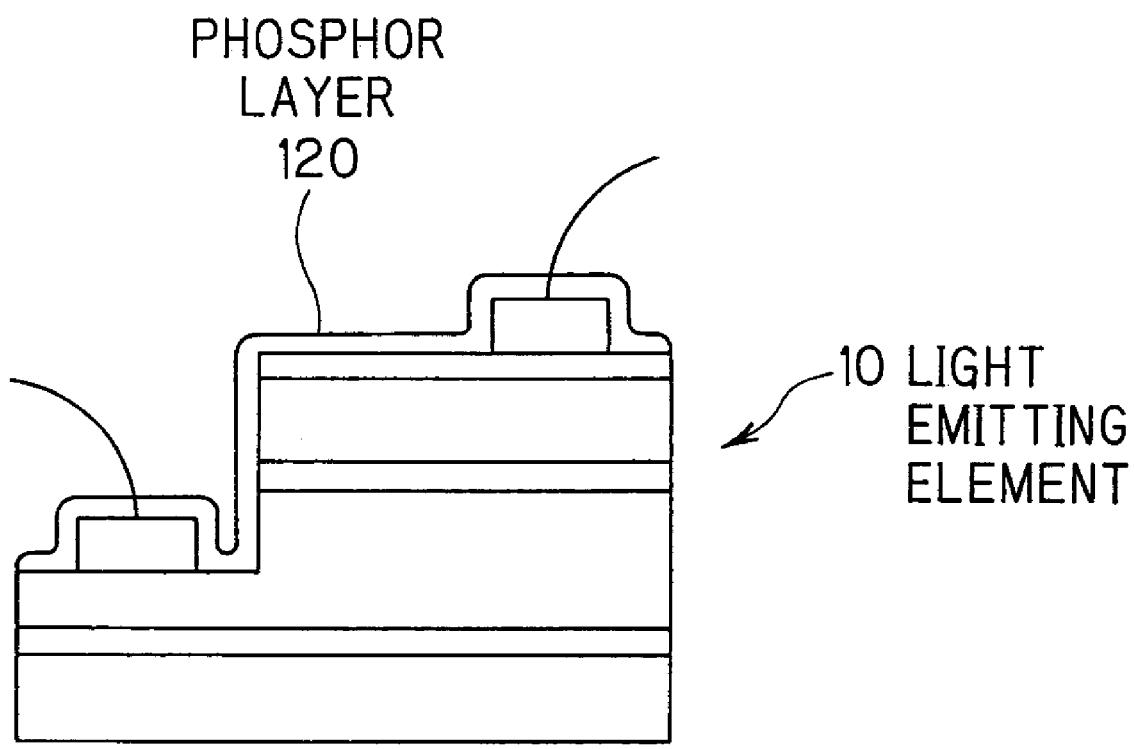
FIG. 12 is a cross sectional view showing part of light emitting device in a fourth preferred embodiment of the invention.
Figure 13:
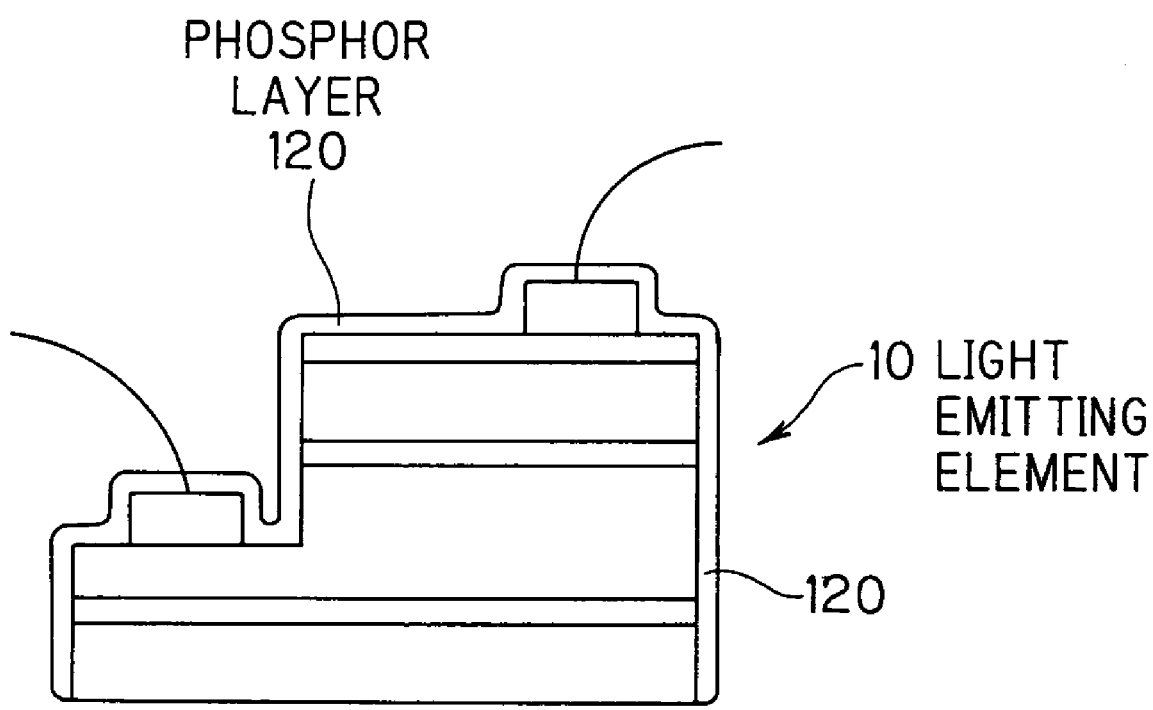
FIG. 13 is a cross sectional view showing modification 1 of the fourth embodiment.
Figure 14:
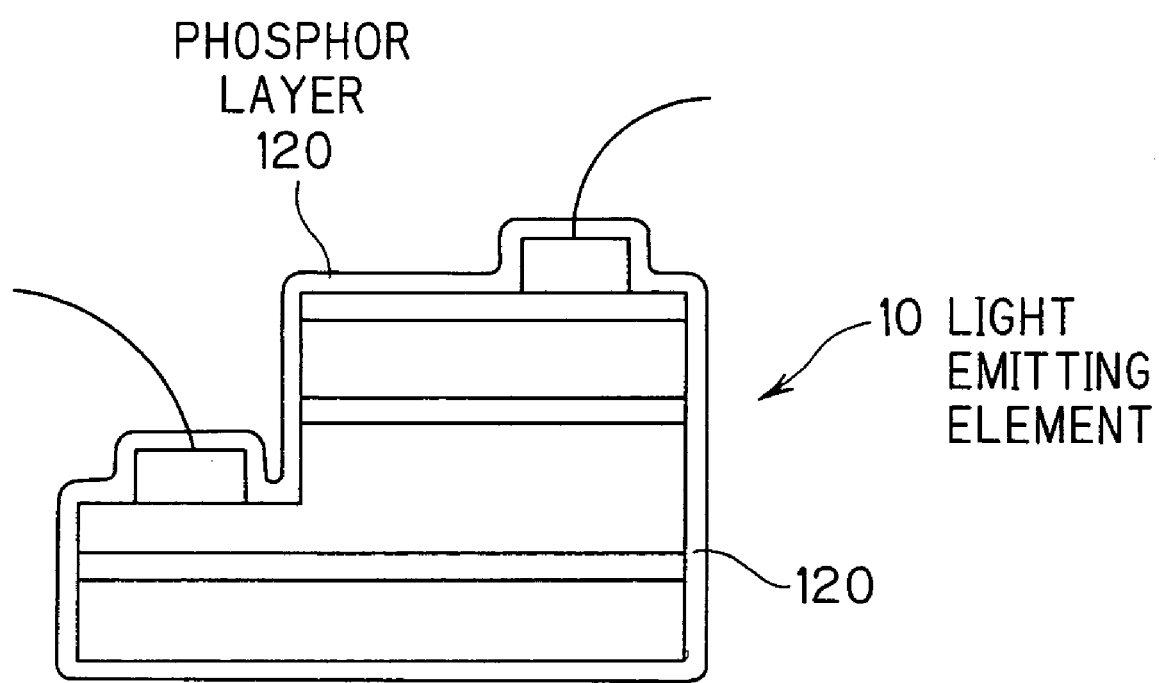
FIG. 14 is a cross sectional view showing modification 2 of the fourth embodiment.
Figure 15:
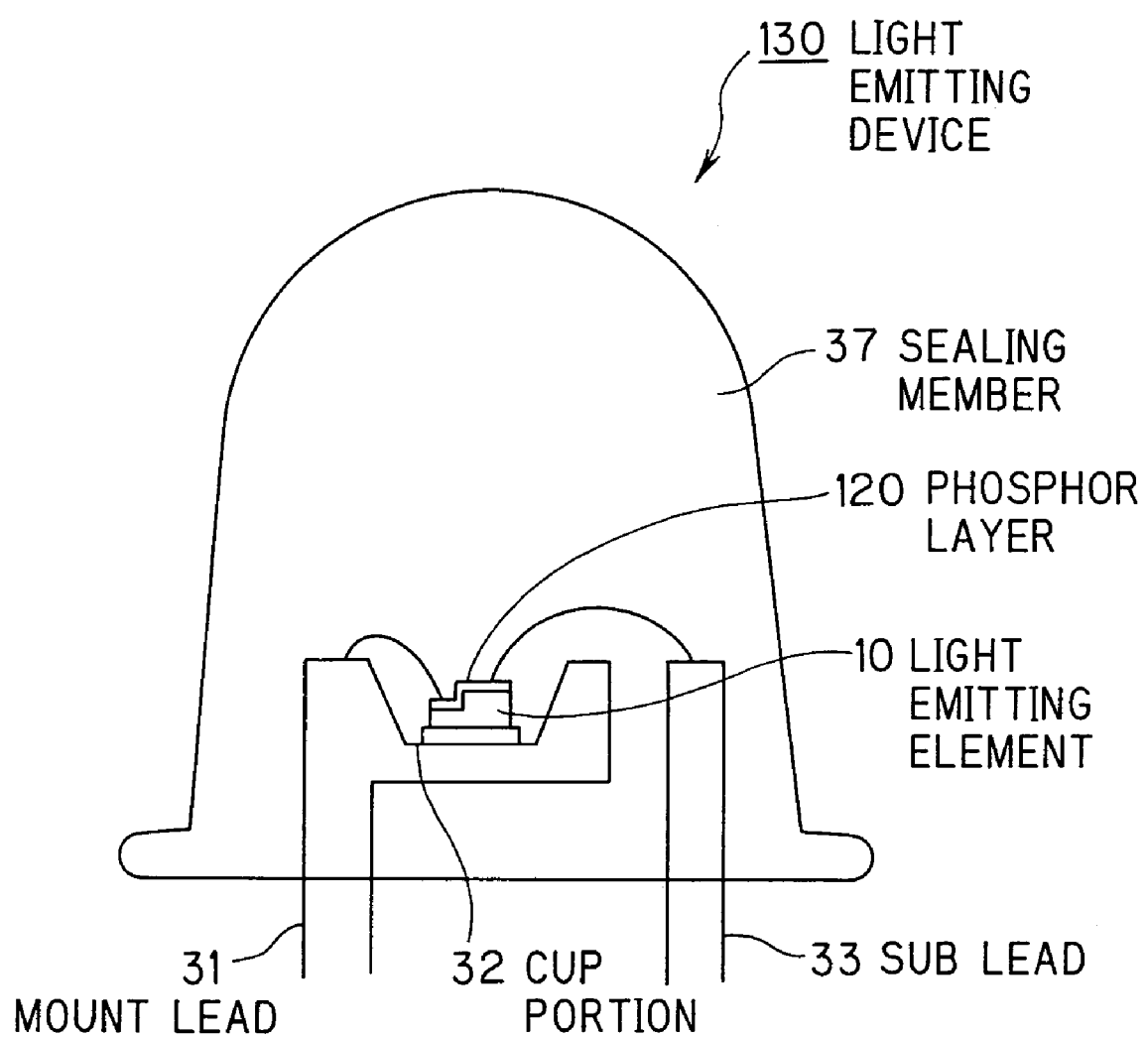
FIG. 15 is a cross sectional view showing the light emitting device in the fourth preferred embodiment of the invention.

FIG. 12 is a cross sectional view showing part (light emitting element, phosphor layer) of light emitting device in the fourth preferred embodiment of the invention. FIG. 13 is a cross sectional view showing modification 1 of the fourth embodiment. FIG. 14 is a cross sectional view showing modification 2 of the fourth embodiment. FIG. 15 is a cross sectional view showing the light emitting device in the fourth preferred embodiment of the invention.

In the fourth embodiment, a face-up type III group nitride system compound semiconductor light emitting element 10 as shown in FIG. 2 is used. The light emitting element 10 emits blue system light.

Phosphor layer precursor material is prepared as follows.

At first, agitating a mixture of γ-glycidoxypropyltrimethoxysilane of 70.71 g, water of 32.32 g and isopropylcellosolve of 54.97 g at room temperature in a beaker of 200 ml for one hour, inorganic-coating forming liquid is obtained.

Adding YAG system phosphor particles (average particle diameter of 3 μm) of 61.0 g to inorganic-coating forming liquid, dispersing it in a ball mill pot for three hours, the phosphor layer precursor material is obtained.

Baking the phosphor layer precursor material at 400° C. for 10 min while providing it between the light emitting element and cup portion, the inorganic-coating forming liquid is hardened to have thin transparent inorganic binding layer to cover the phosphor particles. Thereby, the phosphor particles are bonded to each other to form a phosphor layer.

In detail, the phosphor layer precursor material is coated on the top surface (main emission surface) of light emitting element 10 before being separated from a wafer, then thermally treated on the above conditions (400° C., 10 min.), thereby phosphor layer 120 is formed on the top surface of light emitting element 10 as shown in FIG. 12.

On the other hand, when the phosphor layer precursor material is coated on a light emitting element 10 separated from the wafer, the phosphor layer precursor material can be coated also on the side of light emitting element by virtue of its fluidity. Further, when a light emitting element is soaked in phosphor layer precursor material, then the entire surface of light emitting element can be coated with the phosphor layer precursor material. By thermally treating them, the entire surface or top and side surfaces of light emitting element can be covered with phosphor layer (See FIG. 13 and FIG. 14).

FIG. 15 shows a light emitting device 130 in which the light emitting element 10 covered with phosphor layer 120 is installed. In the light emitting device 130, the light emitting element 10 is bonded to the cup portion 32 of mount lead 31. The mount lead 31 and sub lead 33 are sealed with sealing member 37 of lamp shape.

In operation of light emitting device 130, light radiated from the light emitting element 10 excites phosphor in the phosphor layer 120 and fluorescent light is radiated from the phosphor. For example, when the light emitting element 10 is blue system LED and phosphor to be excited by blue light is used, white system light can be output from the light emitting device 130.

Figure 16:
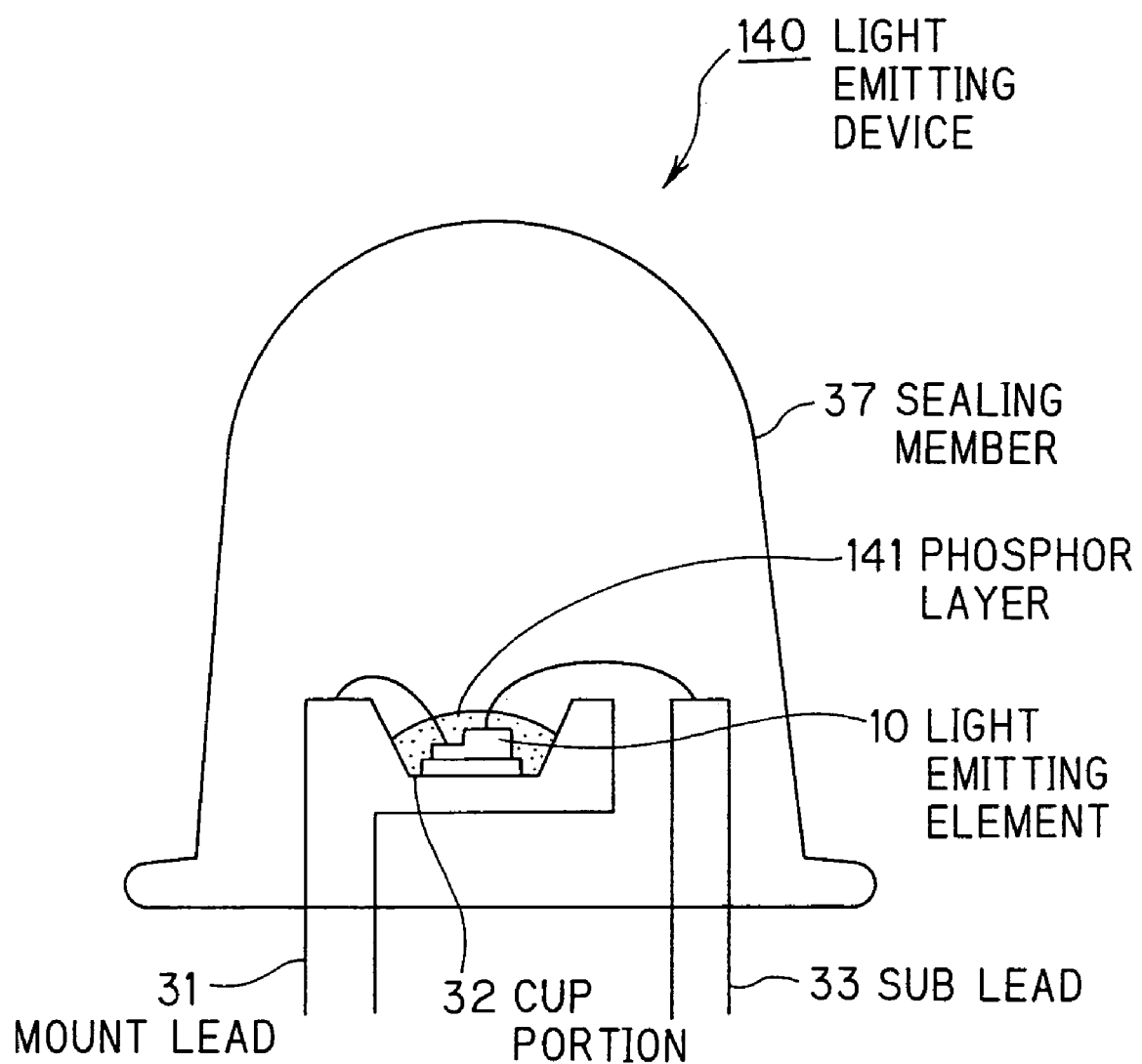
FIG. 16 is a cross sectional view showing a light emitting device 140, modification 3 of the fourth embodiment.

FIG. 16 is a cross sectional view showing a light emitting device 140, modification 3 of the fourth embodiment. In the light emitting device 140, phosphor layer precursor material is filled and hardened in the cup portion 32 instead of forming the phosphor layer 120 on the surface of light emitting element 10. Thereby, phosphor layer 141 covering the entire light emitting element can be obtained. Meanwhile, in this embodiment, since phosphor is densely filled in the phosphor layer 141, the light transmissivity of phosphor layer may lower depending on rind of phosphor. In this case, it is preferable that transparent filling particles are mixed with phosphor particles in order to secure the passage of light.

Fifth Embodiment

Figure 17:
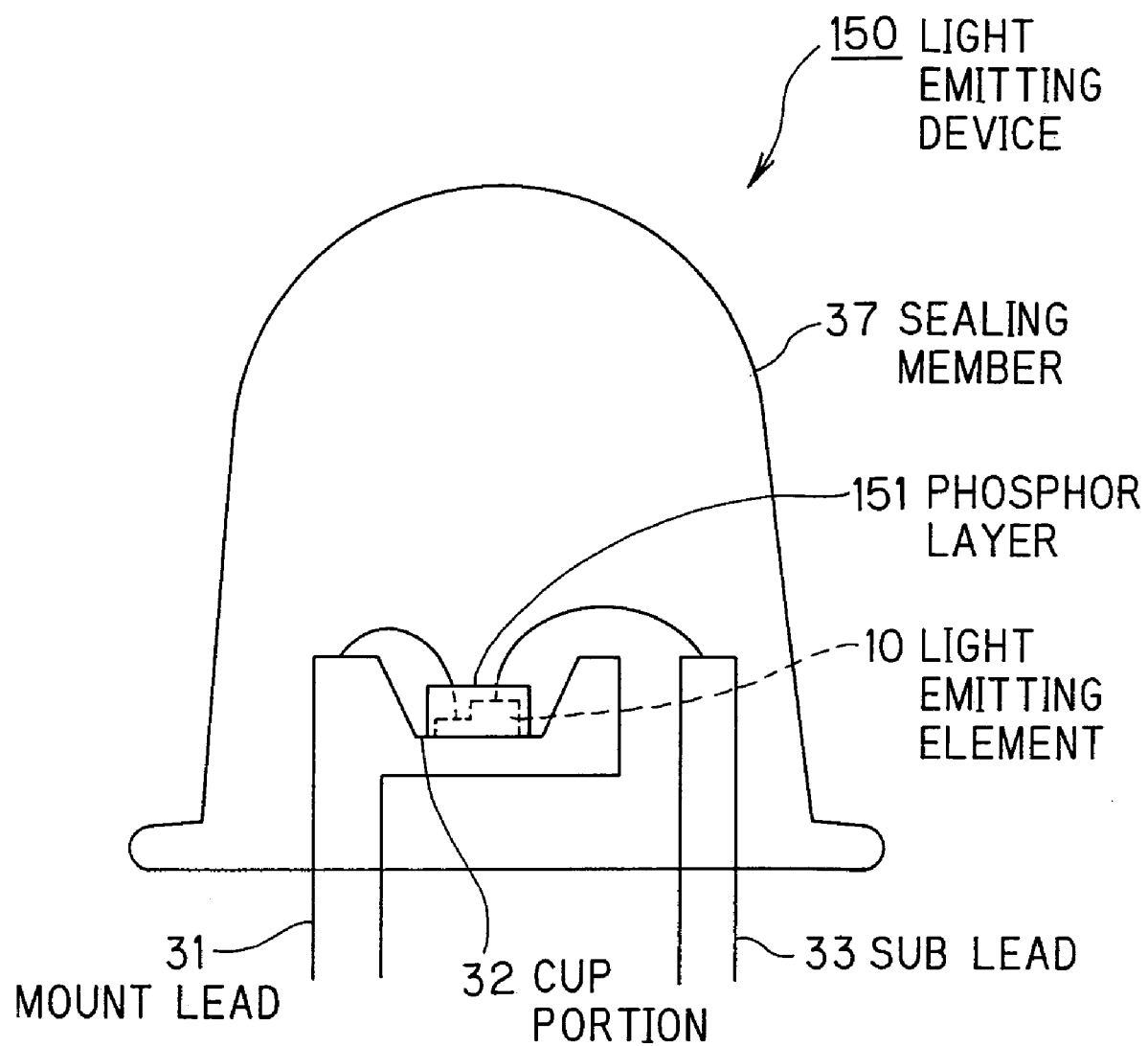
FIG. 17 is a cross sectional view showing a light emitting device in a fifth preferred embodiment of the invention.
Figure 18:
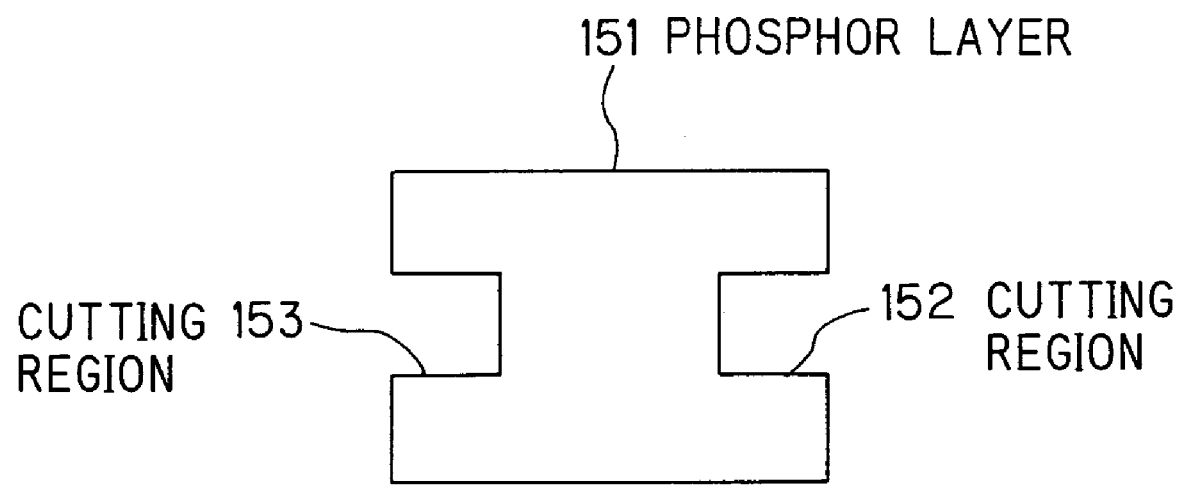
FIG. 18 is a top view showing a phosphor layer 151 in FIG. 17.
Figure 20A:
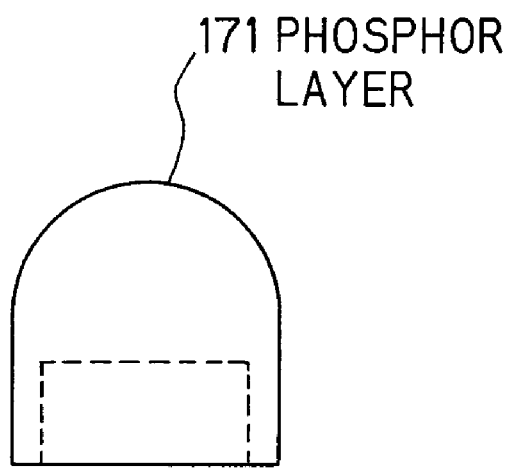
FIGS. 20A and 20B are side views showing variations of a phosphor layer 168 in FIG. 19.
Figure 20B:
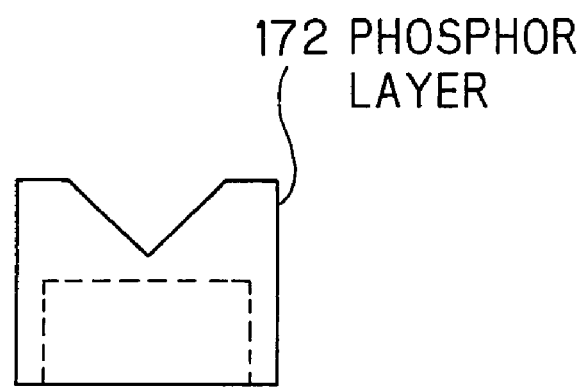
Figure 21:
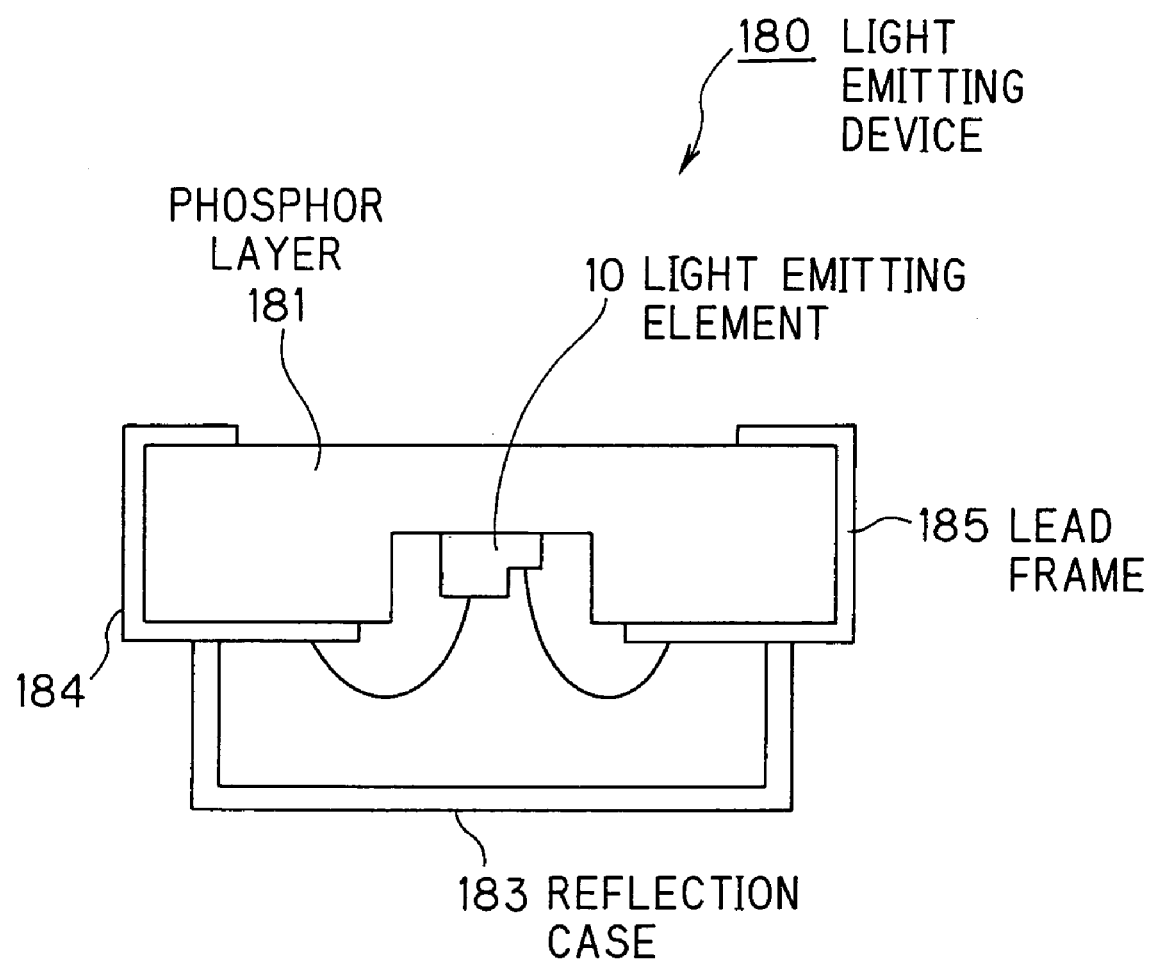
FIG. 21 is a cross sectional view showing part of modification 2 of the fifth embodiment.

FIG. 17 is a cross sectional view showing a light emitting device in the fifth preferred embodiment of the invention. FIG. 18 is a top view showing a phosphor layer 151 in FIG. 17. FIG. 19 is a cross sectional view showing part of modification 1 of the fifth embodiment. FIGS. 20A and 20B are side views showing variations of a phosphor layer 168 in FIG. 19. FIG. 21 is a cross sectional view showing part of modification 2 of the fifth embodiment.

As shown in FIG. 17, in the fifth embodiment, the light emitting device 150 is constructed such that the light emitting element 10 is covered with phosphor layer 151 that is formed cup-shaped by press molding. In FIG. 17, like components are indicated by same numerals used in FIG. 15 and explanations thereof are omitted. As shown in FIG. 18, the phosphor layer 151 formed by press molding is provided with cutting regions 152, 153 to allow bonding wires to escape.

FIG. 19 shows a light emitting device 160 as modification 1 of the fifth embodiment. The light emitting device 160 uses a flip-chip type light emitting element 161. The light emitting element 161 is bonded through bumps 162, 163 to lead frames 165, 166 formed on a base member 164. The light emitting element 161 is covered with phosphor layer 168 that is formed box-shaped by press molding. The flip-chip type light emitting element 161 is composed such that, in the face-up type shown in FIG. 2, a thick p-electrode covering the surface of p-type layer is formed instead of the transparent electrode 16 and pad-like p-electrode 17.

Alternatively, the phosphor layer 168 may be replaced by another phosphor layer shaped by press molding as shown in FIG. 20A or 20B. Phosphor layer 171 shown in FIG. 20A is of lamp type. Phosphor layer 172 shown in FIG. 20B is of reflection lens type.

FIG. 21 shows a light emitting device 180 as modification 2 of the fifth embodiment. The light emitting device 180 is constructed such that a phosphor layer 181 formed by molding is used as a base member and the light emitting element 10 is mounted on the phosphor layer 181. In FIG. 21, 183 is a reflection case, 184 and 185 are lead frames. In the light emitting device 180 thus constructed, light emitted from the light emitting element 10 is reflected on the reflection case 183, then entering the phosphor layer 181 to excite phosphor in the phosphor layer 181.

Sixth Embodiment

Figure 22:
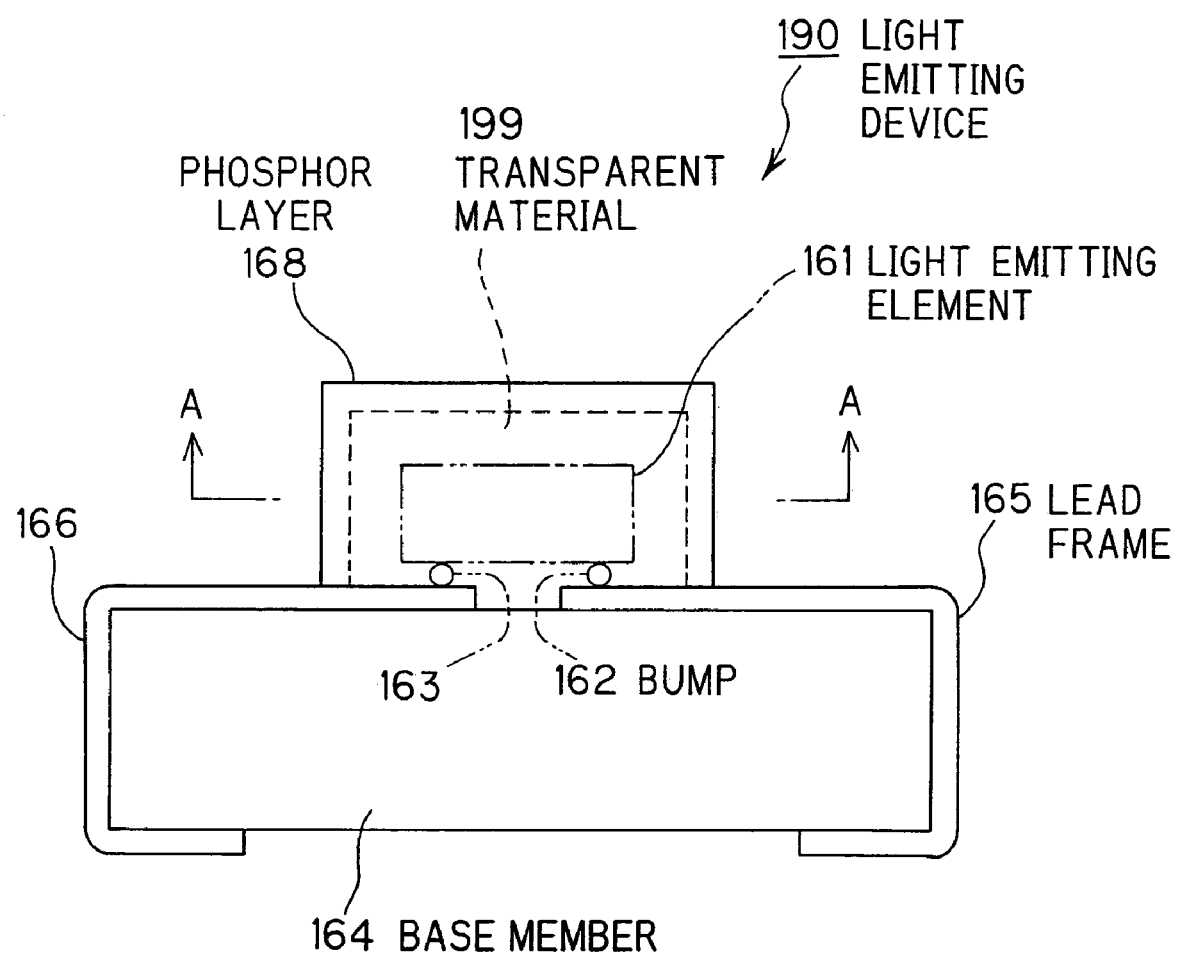
FIG. 22 is a cross sectional view showing part of a light emitting device 190 in a sixth preferred embodiment of the invention.
Figure 23:
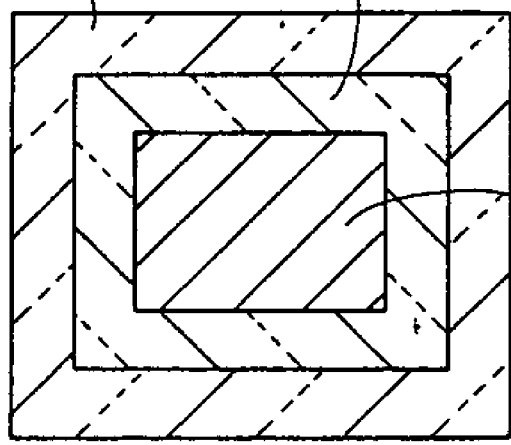
FIG. 23 is a cross sectional view cut along the line A-A in FIG. 22.

FIG. 22 is a cross sectional view showing part of a light emitting device 190 in the sixth preferred embodiment of the invention. FIG. 23 is a cross sectional view cut along the line A-A in FIG. 22.

In the sixth embodiment, transparent material 199 is filled between the box-type phosphor layer 168 formed by molding and flip-chip type light emitting element 161.

Although phosphor contained in the phosphor layer 168 is not specifically limited, YAG system phosphor and BOS system phosphor are preferable. For these phosphors, the light emitting element 161 may be used that emits one or more of ultraviolet light, red system light, blue system light, yellow system light and green system light.

When a phosphor such as YAG system phosphor with high light conversion efficiency is used that a sufficient wavelength conversion function can be given even in small amount, it is preferable to introduce a filler such as $SiO_2$, $Al_2O_3$ and $TiO_2$ in the phosphor layer precursor material. This is because the formability of phosphor layer 168 can be enhanced by introducing the filler. Even when the filler is introduced, the entire phosphor layer 168 can have a sufficient light conversion function because the phosphor itself has high light conversion efficiency.

The thickness of phosphor layer may be arbitrarily determined according to a color tone required to the light emitting device. It is not necessary for the phosphor layer 168 to have an equal thickness in the entire area. The thickness can be varied depending on the intensity of light emitted from the light emitting element 161.

The lower end of phosphor layer 168 is to be located lower than the light emitting layer of light emitting element 161. It is preferable, as shown in FIG. 22, that the lower end of phosphor layer 168 abuts on the surface of base member 164 on which the light emitting element 161 is mounted. Thereby, light emitted from the side of, light emitting element 161 can be securely introduced in the phosphor layer 168 to be wavelength-converted.

As shown in FIG. 23, transparent inorganic material 199 is filled, with leaving substantially no space, between the phosphor layer 168 and light emitting element 161. By filling the transparent inorganic material 199, an air layer existed therebetween is eliminated. Thus, since the transparent inorganic material 199 with a higher refractive index than air or vacuum state exists around the light emitting element 161, the light extraction efficiency from light emitting element 161 can be enhanced. Further, heat generated from the light emitting element 161 is evenly radiated through the transparent inorganic material 199 and phosphor layer 168 to the sealing member 37 located outside them, such even radiation of heat prevents the heat deterioration of sealing member 37. Furthermore, since heat generated from the light emitting element 161 is more efficiently radiated by the transparent inorganic material 199, the heat deterioration in function of light emitting element 161 can be also prevented. In addition, since the mechanical strength of phosphor layer 168 is reinforced by the transparent inorganic material, the sealing member 37 can be formed easier.

The transparent inorganic material 199 is preferably of inorganic-coating forming liquid composing the phosphor layer precursor material in order to enhance the adhesion property with the phosphor layer 168.

The light emitting device 190 of the sixth embodiment is fabricated as next.

The flip-chip type light emitting element 161 is bonded through bumps 162, 163 to the lead frames 165, 166. In separate step, the box-type phosphor layer 168 is made by molding. Filling inorganic-coating forming liquid with transparency and with fluidity into the box-type phosphor layer 168, the light emitting element 161 is covered with the phosphor layer 168. Thereby, the inorganic-coating forming liquid is filled between the phosphor layer 168 and light emitting element 161. Then, by conducting the thermal treatment, inorganic-coating forming liquid is hardened and the phosphor layer 168 is securely bonded to the light emitting element 161.

Although the invention has been described with respect to the specific embodiments for complete and clear disclosure, the appended claims are not to be thus limited but are to be construed as embodying all modifications and alternative constructions that may occur to one stilled in the art which fairly fall within the basic teaching herein set forth.

What is claimed is:

1. A light emitting device, comprising:
   a light emitting element; and
   an adhesion layer to bond the light emitting element to a mounting member,
   wherein the adhesion layer is composed of inorganic material particles and a transparent inorganic binding layer to be formed between the neighboring inorganic material particles, and the inorganic material particles are substantially connected with each other in the adhesion layer, and
      wherein the inorganic material particles are covered with the transparent inorganic binding layer, and the transparent inorganic binding layer has a thickness of equal to or less than an average diameter of the inorganic material particles.

2. The light emitting device according to claim 1, wherein:
   the inorganic material particles are of diamond.

3. The light emitting device according to claim 1, wherein:
   the light emitting element is of flip-chip type, and a space between an electrode face of the light emitting element and the mounting member is filled with the adhesion layer.

4. An adhesion layer for bonding a light emitting element to a member, comprising:
   diamond particles; and
   a transparent inorganic binding layer,
      wherein the diamond particles are covered with the transparent inorganic binding layer, and the transparent inorganic binding layer has a thickness of equal to or less than an average diameter of the diamond particles, and
   wherein the diamond particles are substantially connected each other in the adhesion layer.

5. A light emitting device, comprising:
   a light emitting element; and
   an adhesion layer to bond the light emitting element to a mounting member,
   wherein the adhesion layer is formed by thermally treating adhesion layer precursor material in which inorganic-coating forming liquid and diamond particles are mixed, the inorganic-coating forming liquid being a transparent inorganic binding layer, the diamond particles being covered with the transparent inorganic binding layer, and the transparent inorganic binding layer having a thickness of equal to or less than an average diameter of the diamond particles.

* * * * *